(12) United States Patent
Yano et al.

(10) Patent No.: US 7,560,307 B2
(45) Date of Patent: Jul. 14, 2009

(54) RESIN COMPOSITION, HEAT-RESISTANT RESIN PASTE AND SEMICONDUCTOR DEVICE USING THESE AND METHOD OF PREPARING THE SAME

(75) Inventors: Yasuhiro Yano, Ichihara (JP); Hidekazu Matsuura, Ichihara (JP); Yoshihiro Nomura, Ichihara (JP); Yoshii Morishita, Hitachi (JP); Touichi Sakata, Hitachinaka (JP); Hiroshi Nishizawa, Kitaibaraki (JP); Toshiaki Tanaka, Tsukuba (JP); Masaaki Yasuda, Tsukuba (JP); Aizou Kaneda, Yokohama (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 425 days.

(21) Appl. No.: 11/403,810

(22) Filed: Apr. 14, 2006

(65) Prior Publication Data

US 2006/0180908 A1    Aug. 17, 2006

Related U.S. Application Data

(62) Division of application No. 10/220,846, filed on Sep. 6, 2002, now Pat. No. 7,061,081.

(30) Foreign Application Priority Data

| Mar. 6, 2000 | (JP) | ............................... 2000-65718 |
| Mar. 9, 2000 | (JP) | ............................... 2000-70975 |
| Mar. 9, 2000 | (JP) | ............................... 2000-71023 |
| Mar. 9, 2000 | (JP) | ............................... 2000-71024 |
| Mar. 9, 2000 | (JP) | ............................... 2000-71025 |
| Jul. 26, 2000 | (JP) | ............................... 2000-224762 |

(51) Int. Cl.
| H01L 21/50 | (2006.01) |
| H01L 21/48 | (2006.01) |
| H01L 21/44 | (2006.01) |
| H01L 21/4763 | (2006.01) |
| H01L 21/469 | (2006.01) |
| H01L 21/31 | (2006.01) |

(52) U.S. Cl. ...................... 438/113; 438/622; 438/623; 438/637; 438/629; 438/118; 438/778

(58) Field of Classification Search ................ 438/113, 438/118, 622, 623, 629, 637, 778
See application file for complete search history.

(56) References Cited

U.S. PATENT DOCUMENTS 5,037,862 A    8/1991    Nishizawa et al.

(Continued)

FOREIGN PATENT DOCUMENTS

EP    384036    8/1990

(Continued)

*Primary Examiner*—Luan C Thai
(74) *Attorney, Agent, or Firm*—Antonelli, Terry, Stout & Kraus, LLP.

(57) ABSTRACT

There are disclosed a resin composition comprising (A) a heat-resistant resin soluble in a solvent at room temperature, (B) a heat-resistant resin which is insoluble in a solvent at room temperature but becomes soluble by heating, and (C) a solvent; a heat-resistant resin paste further containing (D) particles or liquid state material D showing rubber elasticity; and a semiconductor device using the same and a method for producing the same.

6 Claims, 1 Drawing Sheet

U.S. PATENT DOCUMENTS

Figure 1A:
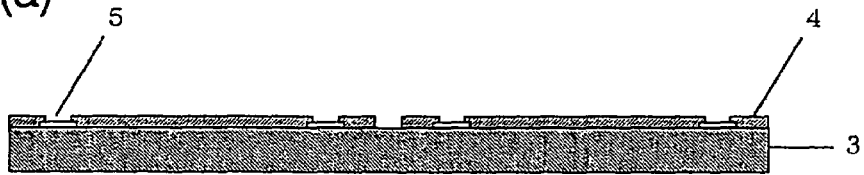

| | | |
|---|---|---|
| 5,087,658 A | 2/1992 | Nishizawa et al. |
| 5,164,816 A | 11/1992 | Nishizawa et al. |
| 5,374,677 A | 12/1994 | Nishio et al. |
| 5,834,844 A * | 11/1998 | Akagawa et al. ............ 257/734 |
| 6,187,615 B1 * | 2/2001 | Kim et al. .................... 438/113 |
| 6,492,200 B1 * | 12/2002 | Park et al. ................... 438/113 |
| 6,555,908 B1 * | 4/2003 | Eichelberger et al. ....... 257/737 |

FOREIGN PATENT DOCUMENTS

| | | |
|---|---|---|
| JP | 3287668 | 12/1991 |
| JP | 4285660 | 10/1992 |
| JP | 4285662 | 10/1992 |
| JP | 07316427 | 12/1995 |

* cited by examiner

RESIN COMPOSITION, HEAT-RESISTANT RESIN PASTE AND SEMICONDUCTOR DEVICE USING THESE AND METHOD OF PREPARING THE SAME

CROSS-REFERENCE TO RELATED APPLICATION

This application is a divisional application of U.S. application Ser. No. 10/220,846, filed Sep. 6, 2002, now U.S. Pat. No. 7,061,081 the contents of which are incorporated herein by reference.

TECHNICAL FIELD

This invention relates to a resin composition, a heat-resistant resin paste and a semiconductor device using these and a method of preparing the same, more specifically to a resin composition excellent in adhesive property, heat-resistance and flexibility, a heat-resistant paste which can provide a heat-resistant resin layer which is widely utilized as a coating material, adhesive and stress releasing material of a semiconductor device, is capable of optionally controlling an elasticity and has a little temperature dependency of the elasticity, and can provide such a heat-resistant resin film, and a semiconductor device using these and a method of preparing the same.

BACKGROUND ART

In recent years, electronic parts are becoming small sized and thin, and it is an important technical task to relax a stress with regard to a material applied to these parts. For example, with regard to a material which is directly coating the electronic parts, a high stress relaxing property is required. In particular, whereas the size of the whole parts is becoming small, a chip mounted thereon is becoming a large sized and thin so that a damage caused by the stress at the time of curing or after curing is likely caused. Under these background situations, the resin itself is required to have less stress. In particular, for forming a product in which a plural number of bear chips are mounted on the same substrate like an IC card or a resin dam of a lead frame, a slight residual stress at the time of curing becomes a cause of breakage of wiring, warpage of a substrate or distortion of a frame.

For forming a product on which a plural number of bear chips are mounted on the same substrate like an IC chip or a resin dam of a lead frame, an epoxy resin, etc., has conventionally been used, but the resin has a large stress accompanied by shrinkage at curing so that breakage of wiring or occurrence of crack after curing becomes problems in a heat cycle test after curing or a solder reflow test. Also, with regard to strain at the time of forming a resin dam on a lead frame, a mold resin is flown out from the portion at which strain occurs whereby there is a problem of molding failure at molding.

To solve these problems, an attempt has been made in Japanese Provisional Patent Publication No. 311520/1990 by adding a silicone rubber elastic material to an epoxy resin composition where by providing a flexibility and relaxing stress. However, there are problems that adhesiveness is lowered or resin strength is lowered.

Also, in CSP (chip size package), a solder connecting portion is plastically deformed in a semiconductor device in a surface mounting type such as a bear chip packaging, by a stress caused by the difference of thermal expansion coefficients between a semiconductor element and a substrate, and when this is repeated, the device is broken by fatigue. Thus, it has been carried out a device to reduce a stress caused by the difference in the thermal expansion coefficient of a substrate by providing an inter poser or a stress relaxing layer between the semiconductor element and the substrate. For example, in a semiconductor device shown in Japanese Provisional Patent Publication No. 79362/1998, stress is relaxed by making a bump high. Also, for the purpose of ensuring high reliability of a package in a heat cycle test or a solder reflow test, etc., a stress relaxing layer or an adhesive layer comprising a low elasticity material to relax the difference of the thermal expansion coefficients of a silicon chip and a substrate has been used. Moreover, in a bear chip practical packaging, there is no structure at the inside of the semiconductor to relax the stress so that a device to reduce the stress caused by the difference of the thermal expansion coefficients of the substrate has been carried out by providing an underfill resin layer between the semiconductor element and the substrate.

However, in the structure of relaxing a stress at the connecting portion by the height of the bump as mentioned above, the stress is rather concentrated to the bump itself so that there is a problem of causing connection failure. Also, in the method of using the underfill resin layer in combination, a resin is required to fill in a narrow gap between the semiconductor device and the substrate so that a filling operation is troublesome. Moreover, it is difficult to fill the resin uniformly in the whole portion of the gap so that there is a problem of lowering in production efficiency of the semiconductor device.

In μBGA (ball grid array) which is one example of CSP, a low elastic material has been used for the purpose of ensuring connection reliability between a lead from a "TAB" (tape automated bonding) tape and an electrode on a silicon chip, and adhering the TAB tape and the silicon chip.

Moreover, as a technique of integrating a wafer process and a package process which had been completely separated, a wafer level CSP process in which a package is prepared in a wafer state with the same size as the chip size has been proposed. According to this process, not only the production cost of the package can be reduced but also wire length can be shortened so that there are merits that a signal delay or noise in the package can be reduced and high speed moving can be realized.

In this package, to ensure high reliability, it is necessary to use a stress relaxing layer or an adhesive layer comprising a low elastic material to relax the difference of the thermal expansion coefficients between the silicon chip and the substrate as in the conventional CSP such as μBGA.

In the wafer level CSP process, to connect an electrode of the chip to an outer practically mounting substrate, a metal layer which is so-called a re-wiring layer is formed on a stress relaxing layer by the sputtering method or the plating method, so that it is required not only to be low elasticity but also to have resistances to sputtering or plating.

However, the low elasticity material used in μBGA is low elasticity but is poor in heat resistance so that it has low resistance to sputtering or plating whereby it cannot be applied to the wafer level CSP process as such.

On the other hand, it has been carried out an attempt to relax the stress by adding a monomer component having rubber elasticity to an epoxy resin to lower the elasticity (Japanese Provisional Patent Publication No. 48544/1986), but by using these components in combination, there is a problem of lowering heat resistance of the resin.

A thermoplastic resin having high heat resistance generally has high resin elasticity and mechanical strength but is brittle so that it is applied to electronic parts as such, there are high possibility of causing inconveniences such as occurrences of warpage of a substrate after curing or resin crack in a thermal shock test. Thus, in Japanese Provisional Patent Publication No. 123824/1989, a method of copolymerizing a monomer component having rubber elasticity in a resin has been proposed. However, this method becomes a cause of lowering heat resistance of the resin itself so that it is not preferred.

In recent years, a polyimide, polyamide imide or polyamide resin, etc. excellent in heat resistance and mechanical resistance have widely been used in the field of electronics for a surface protective film or an interlayer insulating film of a semiconductor element. Recently, as a producing method of these surface protective film or interlayer insulating film, screen printing or dispense coating has been attracted attention. Also, as a method of forming a heat-resistant resin on a substrate such as chip, etc., spin coating method, screen printing method, dispense method, film laminate method, etc., have been known.

A material which realizes screen printing, there may be mentioned a material in which a filler is dispersed in a varnish such as a heat-resistant polyimide resin, etc., as a binder to make a paste. The filler of this material provide an effect of giving thixotropic property to the paste. As the filler, there is a method of using silica fine particles or heat-resistant insoluble polyimide fine particles. However, these materials involve the problem that many voids or bubbles are remained at the filler interface at heating and drying so that film strength is weak. To solve these problems, a heat-resistant resin paste as disclosed in Japanese Provisional Patent Publication No. 289646/1990 has been developed. This is a paste in which a filler of a polyamic acid is dispersed in a binder of a polyamic acid, and at the time of heating and drying, the filler is firstly dissolved and then, compatibilized with the binder and forms a uniform coating film at the time of film formation. However, it requires imidation step so that curing conditions of 300° C. or higher are required. Also, there are problems that elasticity is high and flexibility is poor. Moreover, in the other polyimide paste, similar problems are involved.

In the spin coating method, there are problems in environmental point and cost that a coating efficiency of the heat-resistant resin solution is generally 10% or less (90% or more are lost without coating to the substrate), etc. On the other hand, the screen printing method using a metal plate or a mesh plate has merits in the points that a heat-resistant resin can be coated only the required parts within a short period of time effectively. Also, the dispense method has merits that a heat-resistant resin can be coated only the required parts without contacting the material to be coated within a short period of time effectively.

As a heat-resistant resin paste which is capable of applying to coating systems excellent in coating efficiency such as the screen printing or the dispense, it has been reported in Japanese Provisional Patent Publication No. 142252/1997 a heat-resistant resin paste capable of forming a thick film pattern by using a heat-resistant resin paste which dissolves in a solvent at the time of heating and drying.

However, this heat-resistant resin has large elasticity so that there is a problem that it cannot be used as such as a stress relaxing material for relaxing the difference in thermal expansion coefficients of a silicon chip and the substrate.

On the other hand, accompanying with the request of making an electronic apparatus with a low cost, it has earnestly been desired to obtain a semiconductor device which realizes the same reliability with the conventional CSP and further the cost is reduced. To cope with the low cost material, it has been proposed a so-called wafer level CSP that is to obtain respective semiconductor devices by forming semiconductor devices together on a semiconductor wafer and then the wafer is cut. The reason why the cost of the method can be reduced is that the packaging step can be carried out on the wafer together so that a number of steps can be reduced as compared with the conventional CSP in which each semiconductor element cut from the wafer is treated, respectively. More specifically, as disclosed in Japanese Provisional Patent Publication No. 79362/1998, a Cu post is formed by an electroplating on a semiconductor wafer, and after encapsulating with a resin, the resin is polished until the top end portion of the Cu post is exposed, and a solder ball is mounted on the exposed Cu post top end portion and the semiconductor wafer is cut to the respective semiconductor devices.

However, in the preparation method of a wafer level CSP conventionally been proposed, a specific mold is required in many cases in the method of using an encapsulating resin. Also, in the method of using a spin coating step when an insulating layer is formed on the wafer surface, there is much loss in a material to be used, and there is a problem that a cost becomes much expensive until a mass production technique is established.

An object of the present invention is to provide a resin composition which can solve the above-mentioned problems, and gives a film having high strength and low elasticity, and excellent in flexibility only by a step of drying a solvent at 250° C. or lower, or by a step of drying a solvent at 250° C. or lower without imidation step.

Also, another object of the present invention is to provide a resin composition capable of forming a precise pattern by screening printing, dispense coating, etc. by giving thixotropic property of the resin composition with an aromatic thermoplastic resin which is insoluble in a polar solvent at room temperature but soluble by heating.

Another object of the present invention is to provide a resin composition capable of obtaining a coated film having the same resin characteristics as the polyimide only by a step of drying a solvent at 250° C. or lower, or by a step of drying a solvent at 250° C. or lower without imidation step, and giving a coated film having high strength and excellent flexibility, and a semiconductor device using the same.

Further object of the present invention is to provide a heat-resistant resin paste which is capable of widely utilizing for a coating material, an adhesive, a stress relaxing material of a semiconductor device, etc., of controlling elasticity optionally and of forming a resin film excellent in heat resistance, has thixotropic property and can be applied to coating systems excellent in coating efficiency such as screen printing and dispense coating, etc.

Still further object of the present invention is to provide a resin for insulating a semiconductor device to be used for a resin layer having high connection reliability by preventing line breakage at the metal wiring or solder connecting portion caused by thermal stress of a semiconductor device having a resin layer, and a semiconductor device using the resin for the resin layer.

Still further object of the present invention is to provide a method of producing a semiconductor device which controls loss of a material at the minimum amount, prevents connection failure and excellent in reliability, and a semiconductor device.

DISCLOSURE OF THE INVENTION

A resin composition of the present invention comprises (A) a heat-resistant resin soluble in a solvent at room temperature, (B) a heat-resistant resin which is insoluble in a solvent at room temperature but becomes soluble by heating and (C) a solvent.

Also, the resin composition of the present invention also comprises (A') an aromatic thermoplastic resin soluble in a polar solvent at room temperature, (B') an aromatic thermoplastic resin which is insoluble in a polar solvent at room temperature but is soluble by heating and (C') an organic solvent.

Moreover, a heat-resistant resin paste of the present invention comprises (A") a heat-resistant resin A" soluble in a solvent (C") at room temperature and a temperature at heating and drying, (B") a heat-resistant resin B" which is insoluble in the solvent (C") at room temperature but is soluble at a temperature at the time of heating and drying, (C") the solvent, and (D) particles or a liquid state material D showing rubber elasticity.

A semiconductor insulating resin of the present invention comprises a resin which gives a resin layer having an elasticity at 25° C. of 0.2 to 3.0 GPa, and an elasticity of said resin layer at 150° C. is 10 to 100% of that of at −65° C., and said resin layer preferably has a glass transition temperature of 180° C. or higher.

A semiconductor device of the present invention comprises using the above-mentioned resin composition, heat-resistant resin past or semiconductor insulating resin.

A method of producing a semiconductor device according to the present invention comprises a step of forming a plural number of resin layers on a semiconductor substrate on which a first wiring layer has been formed; a step of forming, on the resin layer, a second wiring layer electrically connected to an electrode on the semiconductor substrate; a step of forming a protective layer on the second wiring layer except for a portion to which an outer electrode terminal is mounted; and a step of forming the outer electrode terminal on the second wiring layer.

A method of producing a semiconductor device according to the present invention also comprises a step of forming a resin layer on a semiconductor substrate on which a first wiring layer has been formed; a step of providing a through hole(s) at part of the resin layer penetrating to the first wiring layer; and a step of forming a second wiring layer on the resin layer by which an outer connection terminal and the first wiring layer are electrically connected to each other.

A method of producing a semiconductor device according to the present invention further comprises a step of forming a plural number of resin layers on a semiconductor wafer on which a first wiring layer has been formed by printing a resin having an elasticity at 25° C. of 0.2 to 3.0 GPa, a glass transition temperature of 180° C. or higher and a 5% weight-loss temperature of 300° C. or higher; a step of forming a second wiring layer on the resin layer which is electrically connected to an electrode on the semiconductor wafer; a step of forming a plural number of protective layers of the second wiring layer by printing the above resin on the second wiring layer; a step of providing a through hole(s) at the protective layer of the second wiring layer penetrating to of the second wiring layer; and a step of forming an outer electrode terminal to the through hole(s); and a step of cutting the semiconductor wafer to obtain respective semiconductor devices.

BREIF DESCRIPTION OF THE DRAWINGS

FIG. 1 is a sectional view showing preparation steps of a semiconductor device to explain one example of the present invention.

BEST MODE FOR CARRYING OUT THE INVENTION

The present invention relates to a resin composition containing (A) an aromatic thermoplastic resin soluble in a solvent at room temperature, (B) an aromatic thermoplastic resin which is insoluble in a solvent at room temperature but becomes soluble by heating and (C) a solvent.

In the present invention, (A) the aromatic thermoplastic resin soluble in a solvent at room temperature, and (B) the aromatic thermoplastic resin which is insoluble in a solvent at room temperature but becomes soluble by heating are preferably the following resins:

(A') A polyether amide imide or a polyether amide soluble in a polar solvent at room temperature (B') A polyether amide imide, a polyether amide or a polyether imide which is insoluble in a polar solvent at room temperature but is soluble by heating In the present invention, the resin (A') is preferably obtained by reacting the following constitutional components (1), (2) and (3), or (1) and (3).

(1) An aromatic diamine compound represented by the following formula (I):

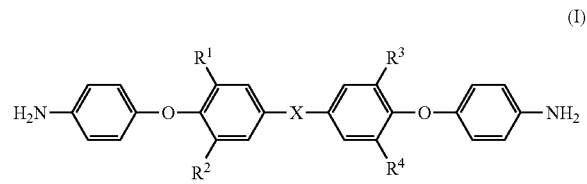

wherein $R^1$, $R^2$, $R^3$ and $R^4$ each independently represent a hydrogen atom, an alkyl group having 1 to 9 carbon atoms, an alkoxy group having 1 to 9 carbon atoms or a halogen atom; X represents a single bonding arm, —O—, —S—, —C(=O)—, —SO$_2$—, —S(=O)— or a group represented by the following formula:

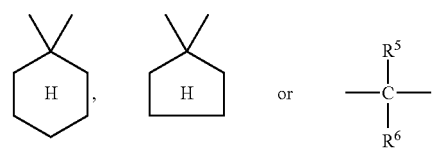

wherein $R^5$ and $R^6$ each independently represent a hydrogen atom, an alkyl group, a trifluoromethyl group, a trichloromethyl group, a halogen atom or a phenyl group, and each of which may be the same or different from each other with the recurring units, (2) a diamine compound comprising the following constitutional components (a) and/or (b);

(a) an aromatic diamine compound other than the compound of the formula (I), (b) an aliphatic or alicyclic diamine compound, (3) an acid compound comprising the following constitutional components (c) and/or (d);

(c) a dicarboxylic acid or a reactive acid derivative thereof, (d) a tricarboxylic acid or a reactive acid derivative thereof.

In the present invention, when the resin (B') is a polyether amide imide or a polyether amide, a resin obtained by reacting the following constitutional components (1), (2) and (3), or (1) and (3) is preferred.
(1) An aromatic diamine compound represented by the above-mentioned formula (I);
(2) a diamine compound comprising the following constitutional components (a) and/or (b);
  (a) an aromatic diamine compound other than the compound of the formula (I),
  (b) an aliphatic or alicyclic diamine compound,
(3) an acid compound comprising the following constitutional components (c) and/or (d) and a tetracarboxylic acid dianhydride represented by the following formula (II) or a reactive acid derivative thereof;
  (c) a dicarboxylic acid or a reactive acid derivative thereof,
  (d) a tricarboxylic acid or a reactive acid derivative thereof,

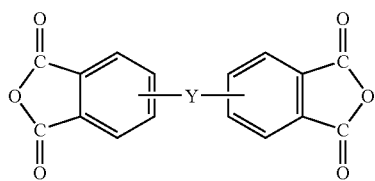
(II)

wherein Y represents a single bonding arm, —O—, —S—, —C(=O)—, —SO$_2$—, —S(=O)—, a group represented by the following formula, or a divalent aromatic hydrocarbon group, aliphatic hydrocarbon group or alicyclic hydrocarbon group, and each of which may be the same or different from each other with the recurring units,

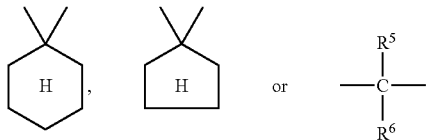

wherein $R^5$ and $R^6$ have the same meanings as defined above.

In the present invention, when the resin (B') is a polyether imide, a resin obtained by reacting the following constitutional components (1), (2) and (3), or (1) and (3) is preferred.
(1) An aromatic diamine compound represented by the above-mentioned formula (I);
(2) a diamine compound comprising the following constitutional components (a) and/or (b);
  (a) an aromatic diamine compound other than the compound of the formula (I),
  (b) an aliphatic or alicyclic diamine compound,
(3) a tetracarboxylic acid dianhydride represented by the above-mentioned formula (II) or a reactive acid derivative thereof.

In the present specification, room temperature means a temperature condition in which a treatment is carried out without conducting any specific designation or control, or the case where a sample or a substance is allowed to stand in a room, and is not specifically limited, and it is preferably a temperature in the range of 10 to 40° C.

Also, heating means an action of elevating the temperature of a sample or a substance at the room temperature or higher, and is not specifically limited by the temperature, and it is preferably elevating the temperature to 50° C. or higher.

The polyether amide imide or the polyether amide in the present invention is preferably a resin containing the following ether group:

and an amide group or an imide group of the following formulae (i), (ii) or (iii) as a recurring unit.

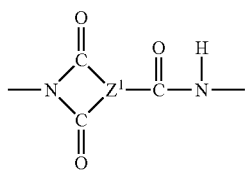
(i)

wherein $Z^1$ represents a trivalent aromatic hydrocarbon group, aliphatic hydrocarbon group or alicyclic hydrocarbon group,

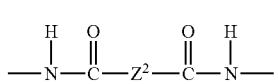
(ii)

wherein $Z^2$ represents a divalent aromatic hydrocarbon group, aliphatic hydrocarbon group or alicyclic hydrocarbon group,

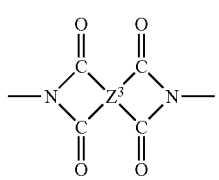
(iii)

wherein $Z^3$ represents a tetravalent aromatic hydrocarbon group, aliphatic hydrocarbon group or alicyclic hydrocarbon group.

Also, the polyether imide in the present invention is preferably a resin having the ether group of the above-mentioned formula and the imide group represented by the formula (iii) as a recurring unit.

The polar solvent in the present invention is not specifically limited so long as it is a solvent constituted by a molecule having a polarity, and, for example, it may include a protonic solvent in which it is easily dissociated and releases a proton (H$^+$) such as an alcohol, a carboxylic acid, etc., or an aprotic solvent in which no proton (h$^+$) is released by dissociation, and the like. There may be preferably mentioned an aprotic solvent such as acetonitrile, dimethoxyethane, dimethylformamide (DMF), dimethylsulfoxide (DMSO), hexamethyl phosphoric acid triamide (HMPA), N-methyl-2-pyrrolidone (NMP), dimethylacetamide (DMAc), γ-butyrolactone, etc.; an ether such as diethylene glycol dimethyl ether, diethylene glycol diethyl ether, diethylene glycol dipropyl ether, diethylene glycol dibutyl ether, triethylene glycol dimethyl ether, triethylene glycol diethyl ether, triethylene glycol dipropyl ether, triethylene glycol dibutyl ether, tetraethylene glycol dimethyl ether, tetraethylene glycol diethyl ether, tetraethylene glycol dipropyl ether, tetraethylene glycol dibutyl ether, diethylene glycol monomethyl ether, diethylene glycol monoethyl ether, diethylene glycol dimethyl ether, triethylene glycol dimethyl ether, triethylene glycol monomethyl ether, triethylene glycol monoethyl ether, tetraethylene glycol monomethyl ether, tetraethylene glycol monoethyl ether, etc.

As the aromatic diamine compound having an ether bond represented by the above-mentioned formula (I) in the present invention, there may be mentioned, for example, 2,2-bis[4-(4-aminophenoxy)phenyl]propane, 2,2-bis[4-(4-aminophenoxy)-phenyl]hexafluoropropane, 2,2-bis[3-methyl-4-(4-aminophenoxy)phenyl]propane, 2,2-bis[4-(4-aminophenoxy)phenyl]butane, 2,2-bis[3-methyl-4-(4-aminophenoxy)phenyl]butane, 2,2-bis[3,5-dimethyl-4-(4-aminophenoxy)phenyl]butane, 2,2-bis[3,5-dibromo-4-(4-aminophenoxy)phenyl]butane, 1,1,1,3,3, 3-hexafluoro-2,2-bis[4-(4-aminophenoxy)phenyl]propane, 1,1,1,3,3,3-hexafluoro-2,2-bis[3-methyl-4-(4-aminophenoxy)phenyl]propane, 1,1-bis[4-(4-aminophenoxy)phenyl]cyclohexane, 1,1-bis[4-(4-aminophenoxy)phenyl]cyclopentane, bis-[4-(4-aminophenoxy)phenyl]sulfone, bis[4-(4-aminophenoxy)phenyl]ether, 4,4'-carbonylbis(p-phenyleneoxy)dianiline, 4,4'-bis(4-aminophenoxy)biphenyl, etc., and of these, 2,2-bis[4-(4-aminophenoxy)phenyl]propane is preferred. If necessary, the above-mentioned aromatic diamine compound may be used in combination of two or more kinds.

In the present invention, a formulation amount of the aromatic diamine compound represented by the formula (I) is preferably 0.1 to 99.9 mol %, more preferably 15 to 99.9 mol %, further preferably 30 to 99.9 mol % based on the total amount of the diamine component.

As the aromatic diamine compound other than those represented by the formula (I) in the present invention, there may be mentioned, for example, m-phenylenediamine, p-phenylenediamine, diamine-m-xylylene, diamino-p-xylylene, 1,4-dinaphthalenediamine, 2,6-dinaphthalenediamine, 2,7-dinaphthalenediamine, 4,4'-diaminodiphenylsulfone, 3,3'-diaminodiphenylsulfone, 3,4'-diaminodiphenylsulfone, 4,4'-diaminodiphenyl ether, 3,3'-diaminodiphenyl ether, 3,4'-diaminodiphenyl ether, 3,4'-diaminobiphenyl, 4,4'-diaminobenzophenone, 3,3'-diaminobenzophenone, o-toluidine, 2,4-toluylenediamine, 1,3-bis(3-aminophenoxy)benzene, 1,4-bis(3-aminophenoxy)benzene, 1,3-bis(4-aminophenoxy)benzene, 1,4-bis(4-aminophenoxy)benzene, bis[4-(3-amino-phenoxy)phenyl]sulfone, 4,4'-bis(4-aminophenoxy)biphenyl, 4,4'-diaminodiphenylsulfide, 3,3'-diaminodiphenylsulfide, 3,4'-diaminodiphenylsulfide, 2,2-bis(4-aminophenyl)propane, 2,2-bis(4-aminophenyl)hexafluoropropane, 2,2-bis(3-amino-4-methylphenyl)propane, 2,2-bis(3-amino-4-methylphenyl)hexafluoropropane, 2,2'-dimethyl-benzidine, 2,2'-bis(trifluoromethyl)benzidine, 4,4'-diamino-3,3',5,5'-tetramethyldiphenylmethane, 4,4'-diamino-3,3',5,5'-tetraethyldiphenylmethane, 4,4'-diamino-3,3',5,5'-tetra-n-propyldiphenylmethane, 4,4'-diamino-3,3',5,5'-tetraisopropyldiphenylmethane, 4,4'-diamino-3,3',5,5'-tetrabutyldiphenylmethane, 4,4'-diamino-3,3'-dimethyl-5,5'-diethyldiphenylmethane, 4,4'-diamino-3,3'-dimethyl-5,5'-diisopropyldiphenylmethane, 4,4'-diamino-3,3'-diethyl-5,5'-diisopropyldiphenylmethane, 4,4'-diamino-3,5-dimethyl-3',5'-diethyldiphenylmethane, 4,4'-diamino-3,5-dimethyl-3',5'-diisopropyldiphenylmethane, 4,4'-diamino-3,5-diethyl-3',5'-diisopropyldiphenylmethane, 4,4'-diamino-3,5-diethyl-3',5'-dibutyldiphenylmethane, 4,4'-diamino-3,5-diisopropyl-3',5'-dibutyldiphenylmethane, 4,4'-diamino-3,3'-diisopropyl-5,5'-dibutyldiphenylmethane, 4,4'-diamino-3,3'-dimethyl-5,5'-dibutyldiphenylmethane, 4,4'-diamino-3,3'-diethyl-5,5'-dibutyldiphenylmethane, 4,4'-diamino-3,3'-dimethyldiphenylmethane, 4,4'-diamino-3,3'-diethyldiphenylmethane, 4,4'-diamino-3,3'-di-n-propyldiphenylmethane , 4,4'-diamino-3,3'-diisopropyldiphenylmethane, 4,4'-di-amino-3,3'-dibutyldiphenylmethane, 4,4'-diamino-3,3',5-trimethyldiphenylmethane, 4,4'-diamino-3,3',5-triethyldiphenylmethane, 4,4'-diamino-3,3',5-tri-n-propyldiphenylmethane, 4,4'-diamino-3,3',5-triisopropyldiphenylmethane, 4,4'-diamino-3,3',5-tributyldiphenylmethane, 4,4'-diamino-3-methyl-3'-ethyldiphenylmethane, 4,4'-diamino-3-methyl-3'-isopropyldiphenylmethane, 4,4'-diamino-3-ethyl-3'-isopropyldiphenylmethane, 4,4'-diamino-3-ethyl-3'-isobutyldiphenylmethane, 4,4'-diamino-3-isopropyl-3'-butyldiphenylmethane, 4,4'-diamino-2,2'-bis(3,3',5,5'-tetramethyldiphenyl)isopropane, 4,4'-diamino-2,2'-bis(3,3',5,5'-tetraethyldiphenyl)isopropane, 4,4'-diamino-2,2'-bis(3,3', 5,5'-tetra-n-propyldiphenyl)isopropane, 4,4'-diamino-2,2'-bis(3,3',5,5'-tetraisopropyldiphenyl)isopropane, 4,4'-diamino-2,2'-bis(3,3',5,5'-tetrabutyldiphenyl)isopropane, 4,4'-diamino-3,3',5,5'-tetramethyldiphenyl ether, 4,4'-di-amino-3,3',5,5'-tetraethyldiphenyl ether, 4,4'-diamino-3,3',5,5'-tetra-n-propyldiphenyl ether, 4,4'-diamino-3,3',5,5'-tetraisopropyldiphenyl ether, 4,4'-diamino-3,3',5,5'-tetrabutyldiphenyl ether, 4,4'-diamino-3,3',5,5'-tetramethyldiphenyl sulfone, 4,4'-diamino-3,3',5,5'-tetraethyldiphenyl sulfone, 4,4'-diamino-3,3',5,5'-tetra-n-propyldiphenyl sulfone, 4,4'-diamino-3,3',5,5'-tetraisopropyldiphenyl sulfone, 4,4'-diamino-3,3',5,5'-tetrabutyldiphenyl sulfone, 4,4'-diamino-3,3',5,5'-tetramethyldiphenyl ketone, 4,4'-diamino-3,3',5,5'-tetraethyldiphenyl ketone, 4,4'-di-amino-3,3',5,5'-tetra-n-propyldiphenyl ketone, 4,4'-diamino-3,3',5,5'-tetraisopropyldiphenyl ketone, 4,4'-diamino-3,3',5,5'-tetrabutyldiphenyl ketone, 4,4'-diamino-3,3',5,5'-tetramethyl benzanilide, 4,4'-diamino-3,3',5,5'-tetraethyl benzanilide, 4,4'-diamino-3,3',5,5'-tetra-n-propyl benzanilide, 4,4'-di-amino-3,3',5,5'-tetraisopropyl benzanilide, 4,4'-diamino-3, 3',5,5'-tetrabutyl benzanilide, metatoluilenediamine, 4,4'-diaminodiphenylethane, 1,4-bis(4-aminocumyl)benzene (BAP), 1,3-bis(4-aminocumyl)benzene, 1,3-bis-(3-aminophenoxy)benzene, 1,4-bis(3-aminophenoxy)benzene, 1,4-bis(4-aminophenoxy)benzene, 2,2-bis[4-(3-aminophenoxy)phenyl]propane, bis[4-(3-aminophenoxy)phenyl]sulfone (m-APPS), bis[4-(4-aminophenoxy)phenyl]sulfone, 2,2-bis[4-(4-aminophenoxy)phenyl]hexafluoropropane, etc. If necessary, the above-mentioned aromatic diamine compound may be used in combination of two or more kinds.

In the present invention, a formulation amount of the aromatic diamine compound other than the aromatic diamine compound represented by the formula (I) is preferably 0.1 to 99.9 mol %, more preferably 15 to 99.9 mol %, further preferably 30 to 99.9 mol % based on the total amount of the diamine component.

As the aliphatic or alicyclic diamine compound in the present invention, it is not specifically limited so long as it is a compound in which an amino group is bonded to an aliphatic or alicyclic hydrocarbon, and there may be mentioned, for example, an aliphatic diamine compound such as 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 3,9-bis(3-aminopropyl)-2,4,8,10-tetraoxaspiro[5.5]undecane (ATU), methylpentamethylenediamine (MPMD), trimethylhexamethylene diamine (TMD), etc., an alicyclic diamine compound such as 1,2-diaminocyclohexane, methylenediaminocyclohexamine (PACM), norbornanediamine (NBDA), etc., diaminosiloxane, a diamine compound in which the main chain is a copolymer of ethylene oxide, propylene oxide, or ethylene oxide and propylene oxide, a diamine compound in which the main chain is rubber, etc. If necessary, the above-mentioned aliphatic or alicyclic diamine compound may be used in combination of two or more kinds.

In the present invention, a formulation amount of the aliphatic or alicyclic diamine compound is preferably 0.1 to 95 mol %, more preferably 0.1 to 90 mol %, further preferably 0.1 to 85 mol % based on the total amount of the diamine component.

In the present invention, the aliphatic or alicyclic diamine compound (b) preferably contains diaminosiloxane represented by the following formula (III):

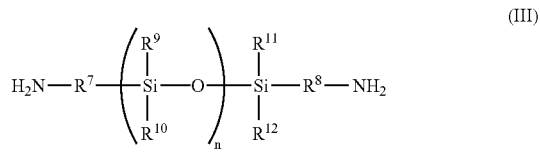

(III)

wherein $R^7$ and $R^8$ each represent a divalent hydrocarbon group, $R^9$ to $R^{12}$ each represent an alkyl group having 1 to 9 carbon atoms, a phenylene group or a phenylene group substituted by an alkyl group, and n is an integer of 1 to 30.

As the diaminosiloxane represented by the above-mentioned formula (III), there maybe mentioned, for example, X-22-161AS, X-22-161A, X-22-161B (all trade names, available from Shin-etsu Kagaku Kogyo K.K., Japan), BY16-853U, BY16-853, BY16-853B (all trade names, available from Dow Corning Toray Silicone Co., Ltd., Japan), TSL9386, TSL9346, TSL9306 (all trade names, available from Toshiba Silicone, K.K., Japan), F2-053-01 (trade name, available from Nippon Unicar, Japan), etc. If necessary, the above-mentioned diaminosiloxane may be used in combination of two or more kinds.

In the present invention, a formulation amount of the diaminosiloxane is preferably 0.1 to 99.9 mol %, more preferably 0.1 to 95 mol %, further preferably 0.1 to 90 mol % based on the total amount of the diamine component.

As the above-mentioned dicarboxylic acid or a reactive acid derivative thereof in the present invention, there may be mentioned, for example, an aliphatic dicarboxylic acid such as oxalic acid, malonic acid, succinic acid, glutaric acid, adipic acid, pimellic acid, suberic acid, azelaic acid, sebacic acid, undecanoic diacid, dodecanoic diacid, tridecanoic diacid, cyclohexane dicarboxylic acid, dimeric acid, etc., an aromatic dicarboxylic acid such as phthalic acid, isophthalic acid, terephthalic acid, naphthalenedicarboxylic acid, oxydibenzoic acid, 4,4'-diphenylether dicarboxylic acid, 4,4'-diphenylsulfone dicarboxylic acid, 4,4'-diphenyl dicarboxylic acid, etc., and a reactive acid derivative thereof, and terephthalic acid and isophthalic acid, and their reactive acid derivatives are preferred since they are easily available. If necessary, the above-mentioned dicarboxylic acid or a reactive acid derivative thereof may be used in combination of two or more kinds.

In the present invention, a formulation amount of the dicarboxylic acid or a reactive acid derivative thereof is preferably 80 to 150 mol %, more preferably 90 to 150 mol % based on the total amount of the diamine component.

As the above-mentioned tricarboxylic acid or a reactive acid derivative thereof, there may be mentioned trimellitic acid, 3,3,4'-benzophenone tricarboxylic acid, 2,3,4'-diphenyl tricarboxylic acid, 2,3,6-pyridine tricarboxylic acid, 3,4,4'-benzanilide tricarboxylic acid, 1,4,5-naphthalene tricarboxylic acid, 2'-methoxy-3,4,4'-diphenylether tricarboxylic acid, 2'-chlorobenzanilide-3,4,4'-tricarboxylic acid, etc. Also, as a reactive acid derivative of the above-mentioned tricarboxylic acid, there may be mentioned an acid anhydride, halide, ester, amide, ammonium salt of the above-mentioned aromatic tricarboxylic acid, and their examples may include trimellitic anhydride, trimellitic anhydride monochloride, 1,4-dicarboxy-3-N,N-dimethylcarbamoylbenzene, 1,4-dicarbomethoxy-3-carboxybenzene, 1,4-dicarboxy-3-carbophenoxybenzene, 2,6-dicarboxy-3-carbomethoxypyridine, 1,6-carboxy-5-carbamoylnaphthalene, an ammonium salt comprising the above-mentioned aromatic tricarboxylic acid and ammonia, dimethylamine, triethylamine, etc. Of these, trimellitic anhydride and trimellitic anhydride monochloride are preferred.

If necessary, the above-mentioned tricarboxylic acid or a reactive acid derivative thereof may be used in combination of two or more kinds.

In the present invention, a formulation amount of the tricarboxylic acid or a reactive acid derivative thereof is preferably 80 to 150 mol %, more preferably 90 to 150 mol % based on the total amount of the diamine component.

As the tetracarboxylic acid dianhydride represented by the above-mentioned formula (II) or a reactive acid derivative thereof, there may be mentioned, for example, a tetracarboxylic acid dianhydride such as 3,3',4,4'-biphenyltetracarboxylic aciddianhydride, 2,2',3,3'-biphenyltetracarboxylicaciddianhydride, 2,3,3',4'-biphenyltetracarboxylic acid dianhydride, 2,2-bis(3,4-dicarboxyphenyl)propane dianhydride, 2,2-bis(2,3-dicarboxyphenyl)propane dianhydride, 1,1-bis(2,3-di-carboxyphenyl)ethane dianhydride, 1,1-bis(3,4-dicarboxyphenyl)ethane dianhydride, bis(3,4-dicarboxyphenyl)methane dianhydride, bis(3,4-dicarboxyphenyl)sulfone dianhydride, bis(3,4-dicarboxyphenyl)ether dianhydride, 3,4,3',4'-benzophenonetetracarboxylic acid dianhydride, 2,3,2',3'-benzophenonetetracarboxylic acid dianhydride, 2,3,3',4'-benzophenonetetracarboxylic acid dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis (3,4-di-carboxyphenyl)-1,1,3,3-tetramethyldicyclohexane dianhydride, 2,2-bis[4-(3,4-dicarboxyphenoxy)phenyl] hexafluoropropane dianhydride, 2,2-bis[4-(3,4-dicarboxyphenoxy)phenyl]propane dianhydride, 4,4-bis(3,4-dicarboxyphenoxy)diphenylsulfide dianhydride, etc., and their reactive acid derivatives, etc. Here, 3,4,3',4'-benzophenonetetracarboxylic acid dianhydride or bis(3,4-dicarboxyphenyl)ether dianhydride is preferred. If necessary, the above-mentioned tetracarboxylic acid or a reactive acid derivative thereof may be used in combination of two or more kinds.

In the resin composition of the present invention, (C') an organic acid is not particularly limited, and may be mentioned, for example, a nitrogen-containing compound such as N-methylpyrrolidone, dimethylacetamide, dimethylformamide, etc.; a sulfur-containing compound such as sulforane, dimethylsulfoxide, etc.; a lactone such as γ-butyrolactone, γ-valerolactone, γ-caprolactone, γ-heptalactone, α-acetyl-γ-butyrolactone, ε-caprolactone, etc.; a ketone such as methyl ethyl ketone, methyl isobutyl ketone, cyclohexanone, acetophenone, etc.; an ether such as ethylene glycol, glycerin, diethylene glycol dimethyl ether, diethylene glycol diethyl ether, diethylene glycol dipropyl ether, diethylene glycol dibutyl ether, triethylene glycol dimethyl ether, triethylene glycol diethyl ether, triethylene glycol dipropyl ether, triethylene glycol dibutyl ether, tetraethylene glycol dimethyl ether, tetraethylene glycol diethyl ether, tetraethylene glycol dipropyl ether, tetraethylene glycol dibutyl ether, diethylene glycol monomethyl ether, diethylene glycol-monoethyl ether, triethylene glycol monomethyl ether, triethylene glycol monoethyl ether, tetraethylene glycol monomethyl ether, tetraethylene glycol monoethyl ether, etc.

A formulation amount of (C') the organic solvent is preferably 100 to 3500 parts by weight, more preferably 150 to 1000 parts by weight based on 100 parts by weight of the total resin amount.

In the present invention, when a polyether amide imide or a polyether amide is to be obtained, the tetracarboxylic acid or a reactive acid derivative thereof is preferably used in an amount of 0.1 to 90 mol %, more preferably 0.1 to 80 mol % based on the total amount of the diamine component.

In the present invention, when a polyether imide is to be obtained, the tetracarboxylic acid or a reactive acid derivative thereof is preferably used in an amount of 80 to 200 mol %, more preferably 90 to 180 mol % based on the total amount of the diamine component.

In the present invention, an acid compound which is the above-mentioned dicarboxylic acid or a reactive acid derivative thereof and the tricarboxylic acid or a reactive acid derivative thereof alone or in combination thereof is preferably used in an amount of 80 to 140 mol %, more preferably 90 to 120 mol % based on the total amount of the diamine component. When they are used in equimolar amount to the total amount of the diamine compound, a compound having the highest molecular weight tends to be obtained.

In the present invention, an acid compound which is the above-mentioned dicarboxylic acid or a reactive acid derivative thereof and the tricarboxylic acid or a reactive acid derivative thereof alone or in combination thereof and a combination thereof with the tetracarboxylic acid dianhydride represented by the formula (II) or a reactive acid derivative thereof is preferably used in an amount of 80 to 140 mol %, more preferably 90 to 120 mol % based on the total amount of the diamine component. When they are used in equimolar amount to the total amount of the diamine compound, a compound having the highest molecular weight tends to be obtained.

For synthesizing the above-mentioned compounds of the present invention, a conventionally known method which has been used in the reaction of the diamine component and the acid component can be employed as such, and various conditions are not particularly limited and the conventionally known method can be used. This reaction is carried out in an organic solvent. As such an organic solvent, there may be mentioned, for example, a nitrogen-containing compound such as N-methylpyrrolidone, dimethylacetamide, dimethylformamide, 1,3-dimethyl-3,4,5,6-tetrahydro-2(1H)-pyrimidinone, 1,3-dimethyl-2-imidazolidinone, etc.; a sulfur-containing compound such as sulforane, dimethylsulfoxide, etc.; a lactone such as γ-butyrolactone, γ-valerolactone, γ-caprolactone, γ-heptalactone, α-acetyl-γ-butyrolactone, ε-caprolactone, etc.; a ketone such as methyl ethyl ketone, methyl isobutyl ketone, cyclohexanone, acetophenone, etc.; an ether such as ethylene glycol, glycerin, diethylene glycol dimethyl ether, diethylene glycol diethyl ether, diethylene glycol dipropyl ether, diethylene glycol dibutyl ether, triethylene glycol dimethyl ether, triethylene glycol diethyl ether, triethylene glycol dipropyl ether, triethylene glycol dibutyl ether, tetraethylene glycol dimethyl ether, tetraethylene glycol diethyl ether, tetraethylene glycol dipropyl ether, tetraethylene glycol dibutyl ether, diethylene glycol monomethyl ether, diethylene glycol monoethyl ether, triethylene glycol monomethyl ether, triethylene glycol monoethyl ether, tetraethylene glycol monomethyl ether, tetraethylene glycol monoethyl ether, etc.; a phenol such as phenol, cresol, xylenol, etc.; an ester such as ethyl acetate, butyl acetate, ethyl cellosolve acetate ("cellosolve" is trade name), butyl cellosolve acetate ("cellosolve" is trade name), etc.; a hydrocarbon such as toluene, xylene, diethylbenzene, cyclohexane, etc.; a halogenated hydrocarbon such as trichloroethane, tetrachloroethane, methylene chloride, chloroform, monochlorobenzene, etc. These may be used alone or in combination of two or more.

These reactions may be carried out in the above-mentioned organic solvents by reacting the diamine compound and the acid compound preferably at −78 to 100° C., more preferably −50 to 60° C. In the reaction, an inorganic acid acceptor may be added in an amount of 90 to 400 mol % based on the total amount of the diamine compound. Such an inorganic acid acceptor may be mentioned, for example, a tertiary amine such as triethylamine, tripropylamine, tributylamine, triamylamine, pyridine, etc.; a 1,2-epoxide such as propylene oxide, styrene oxide, cyclohexene oxide, etc. Accompanying with the progress of the reaction, a viscosity of the reaction mixture becomes gradually high. In this case, a polyamic acid which is a precursor of the polyether amide imide is formed. This polyamic acid is subjected to imidation by dehydration ring-closure reaction to give a polyether amide imide. In this dehydration ring-closure reaction, there are a thermal ring-closure method in which the dehydration reaction is carried out by heating to 80 to 400° C., a chemical ring-closure method by using a dehydrating agent, and the like.

In the case of the heat ring-closure method, it is preferably carried out while removing water generating in the dehydration reaction outside the reaction system. At this time, the reaction is carried out by heating a reaction solution preferably to 80 to 400° C., more preferably 100 to 250° C. During the reaction, water may be removed by azeotropic distillation by using a solvent which evaporates with water such as benzene, toluene, xylene, etc.

In the case of the chemical ring-closure method, the reaction is carried out in the presence of a chemical dehydrating agent preferably at 0 to 120° C., more preferably 10 to 80° C. As the chemical dehydrating agent, there may be used, for example, an acid anhydride such as acetic anhydride, propionic anhydride, butyric anhydride, benzoic anhydride, etc., a carbodiimide compound such as dicyclohexylcarbodiimide, etc. At this time, the reaction is preferably carried out by using a substance which promotes the cyclization reaction such as pyridine, isoquinoline, trimethylamine, triethylamine, aminopyridine, imidazole, etc. in combination. The chemical dehydrating agent is preferably used in an amount of 90 to 600 mol % based on the total amount of the diamine compound, and the substance which promotes the cyclization reaction is preferably used in an amount of 40 to 300 mol % based on the same. Also, a dehydrating catalyst including a phosphorus compound such as triphenylphosphite, tricyclohexylphosphite, triphenylphosphate, phosphoric acid, phosphor pentoxide, etc., a boron compound such as boric acid, anhydrous boric acid, etc., may be used.

The reaction mixture completed in imidation by the dehydration reaction is poured into a far excessive amount of a solvent which is compatible with the above-mentioned organic solvent and is a poor solvent to the resulting resin such as a lower alcohol including methanol, etc., and resulting precipitates of the resin is obtained by filtration and the solvent is removed by drying to obtain the polyether amide imide of the present invention. The polyether imide of the present invention can be obtained according to the same synthetic method as in the polyether amide imide.

In the polyether amide imide or polyether amide which is soluble in a polar solvent at the room temperature, and the polyether amide imide, polyether amide or polyether imide which is insoluble in a polar solvent at the room temperature but soluble by heating obtained by the above-mentioned method, their formulation amount is not specifically limited, and an optional formulation amount can be employed. It is preferred that the amount of the polyether amide imide, polyether amide or polyether imide which is insoluble in a polar solvent at the room temperature but soluble by heating is 10 to 300 parts by weight, more preferably 10 to 200 parts by weight based on 100 parts by weight of the polyether amide imide or polyether amide which is soluble in a polar solvent at the room temperature.

A method of preparing the resin composition according to the present invention, i.e., the resin composition comprising two kinds of resins of the polyether amide imide or polyether amide which is soluble in a polar solvent at the room temperature, and the polyether amide imide, polyether amide or polyether imide which is insoluble in a polar solvent at the room temperature but soluble by heating, and an organic solvent, is not particularly limited. For example, the polyether amide imide or polyether amide which is soluble in a polar solvent at the room temperature is dissolved in an organic solvent to obtain a varnish, then, the polyether amide imide, polyether amide or polyether imide which is insoluble in a polar solvent at the room temperature but soluble by heating is added to the varnish, and the mixture is heated to 50 to 200° C. to uniformly dissolve the resins and allowed to stand for cooling the mixture to obtain a past of the resin composition containing two kinds of the resins.

In the resin composition of the present invention, a low elasticity filler and/or liquid state rubber each having rubber elasticity is preferably contained.

As the low elasticity filler and/or liquid state rubber each having rubber elasticity, it is not specifically limited, and a filler of an elastic material such as acrylic rubber, fluorine rubber, silicone rubber, butadiene rubber, etc.; or liquid state rubber thereof may be mentioned. Here, in view of heat resistance of the resin composition, silicone rubber is preferably used. Also, it is preferred to use a filler on the surface of which has been subjected to chemical modification by an epoxy group. In place of the epoxy group as mentioned above, those modified by a functional group such as an amino group, an acrylic group, a vinyl group, a phenyl group, etc. By adding these low elasticity filler to the resin composition or a thermoplastic resin having heat resistance, it is possible to make the resulting material low elasticity and to control a modulus of elasticity without impairing heat resistance and adhesiveness.

An average particle size of the low elasticity filler having rubber elasticity the surface of which has been chemically modified to be used in the resin composition of the present invention is preferably 0.1 to 50 μm and finely pulverized in sphere shape or amorphous shape. If the average particle size is less than 0.1 μm, aggregation between the particles likely occurs and it tends to be difficult to sufficiently disperse the particles. Also, if it exceeds 50 μm, the surface of the coated film becomes rough and a uniformly coated film tends to be hardly obtained.

In the resin composition of the present invention, a formulation amount of the low elasticity filler having rubber elasticity the surface of which is chemically modified is preferably 5 to 900 parts by weight, more preferably 5 to 800 parts by weight based on 100 parts by weight of the total amount of the aromatic thermoplastic resin.

In the present invention, by using silicone rubber as the low elasticity filler having rubber elasticity the surface of which is chemically modified and varying a formulation amount thereof, the modulus of elasticity of the resulting material can be controlled in the range of 0.2 to 3.0 GPa, and the modulus of elasticity at 150° C. can be controlled to a value within 10 to 100% of that at −65° C. This characteristic is effective at the time of measuring a temperature cycle test from −55° C. to 150° C. as a reliability evaluation when a semiconductor device is prepared. Also, the resin composition become a low elasticity material while maintaining heat resistance that the glass transition temperature is 180° C. or higher and the thermal decomposition temperature is 300° C. or higher.

The resin composition according to the present invention, i.e., the resin composition comprising two kinds of resins of the polyether amide imide or polyether amide which is soluble in a polar solvent at the room temperature, the polyether amide imide, polyether amide or polyether imide which is insoluble in a polar solvent at the room temperature but soluble by heating, the low elasticity filler and the organic solvent can be obtained by adding the low elasticity filler to the varnish of the aromatic thermoplastic resin, and kneading and stirring by a dispersing machine such as a stirrer, a triple roll mill, a ball mill, a planetary mixer, a disper, a homogenizer, etc. to obtain a resin composition.

In the resin composition of the present invention, an additive or a resin modifier such as a colorant, a coupling agent, etc. may be further added. As the colorant, there may be mentioned carbon black, dye, pigment, etc., and as the coupling agent, an aluminate type coupling agent, a silane type coupling agent, a titanate type coupling agent, a thiol type coupling agent, etc.

The above-mentioned additives may be preferably added in an amount of 50 parts by weight or less based on 100 parts by weight of the total amount of the aromatic thermoplastic resin.

Next, the heat-resistant resin paste of the present invention is explained below.

The heat-resistant resin paste of the present invention may be obtained by making the above-mentioned resin composition as a paste or the following is also preferred.

That is, the heat-resistant resin paste of the present invention comprises (A") a heat-resistant resin A" which is soluble in a solvent (C") at room temperature and a temperature at the time of heating and drying, (B") a heat-resistant resin B" which does not dissolve in a solvent (C") at room temperature but dissolve at a temperature at the time of heating and drying, (C") a solvent C and (D) particles or a liquid material D showing rubber elasticity.

Also, the heat-resistant resin paste of the present invention preferably comprises that (A") the heat-resistant resin A" and (B") the heat-resistant resin B" are each an aromatic polyimide type resin obtained by reacting an aromatic tetracarboxylic acid dianhydride and an aromatic diamine, and the main component of (D) the particles showing rubber elasticity is silicone rubber.

Moreover, in the heat-resistant resin paste of the present invention, it is preferred that (B") heat-resistant resin B" is an aromatic polyimide type resin obtained by reacting an aromatic tetracarboxylic acid dianhydride containing 50 mol % or more of 3,4,3',4'-benzophenone tetracarboxylic acid dianhydride and an aromatic diamine containing 50 mol % or more of 4,4'-diaminodiphenyl ether, and the main solvent of (C") is γ-butyrolactone.

As (A") the heat-resistant resin A" which is soluble in a solvent (C") at room temperature and a temperature at the time of heating and drying, it is preferred to use a material which forms a uniform phase with the heat-resistant resin B" of (B") after heating and drying when the heat-resistant resin paste film is formed by a screen printing, etc., and a film pattern is formed by heating and drying.

That is, it is preferred to use a material which dissolves well in a solvent at a temperature at the time of heating and drying, and well compatible with the heat-resistant resin B" of (B") after heating and drying.

More specifically, for example, a heat-resistant resin having an amide group, an imide group, an ester group or an ether group is preferably used. Moreover, there may be specifically mentioned a polyimide resin, a polyamide imide resin, a polyamide resin, a polyester resin, a polyether resin, etc. With regard to the polyimide resin and the polyamide imide resin, a resin comprising a polyamic acid which is a precursor thereof or a partially imidated polyamic acid may be used.

When the heat-resistance is considered, it is preferred that a 5% thermal weight loss temperature of (A") the heat-resistant resin A" is 300° C. or higher. If it is lower than 300° C., at the heat treatment step at a high temperature, e.g., at the time of mounting a solder ball, an out gas is likely generated and there is a tendency that reliability of a semiconductor device can be difficultly obtained.

When easiness of synthesis, heat-resistance and preservation stability of the paste are considered, it is preferred to use a polyimide resin, and an aromatic polyimide type resin (for example, a polyamic acid obtained by reacting an aromatic tetracarboxylic acid dianhydride and an aromatic diamine, a polyimide in which the above polyamic acid is imidated, etc.) is particularly preferred.

(B") the heat-resistant resin B" which does not dissolve in a solvent (C") at room temperature but dissolve at a temperature at the time of heating and drying is used for giving thixotropic property to the paste.

As the heat-resistant resin A" of (A"), that which is soluble in a solvent at room temperature is used, while as (B") the heat-resistant resin B", that which is not soluble in the solvent of (C") at room temperature is used, but both of the resins have properties soluble in the respective solvents at the temperature at the time of heating and drying.

Also, in the viewpoint of uniformity and mechanical characteristics of the film obtained by heating and drying the heat-resistant resin paste of the present invention, (A") the heat-resistant resin A" and (B") the heat-resistant resin B" preferably have compatibility after heating and drying, and in particular, it is preferred that (A") the heat-resistant resin A" and (B") the heat-resistant resin B" form a uniform phase after heating and drying. This uniform phase may contain an organic solvent remained after heating and drying.

As (B") the heat-resistant resin B", a heat-resistant resin having an amide group, an imide group, an ester group or an ether group is preferably used. As said heat-resistant resin, in the viewpoint of heat-resistance and mechanical characteristics, a polyimide resin or a precursor thereof, a polyamide imide resin or a precursor thereof or a polyamide resin is preferably used.

As the polyimide resin or the precursor thereof, the polyamide imide resin or the precursor thereof or the polyamide resin, it is selected from the above-mentioned exemplary polyamide resin or the precursor thereof, the polyamide imide resin or the precursor thereof, or the polyamide resin used. Incidentally, the respective precursor may be a partially imidated polyamic acid resin.

That is, (B") the heat-resistant resin B" is used selected from fine particles which are insoluble in (C") the solvent of the heat-resistant paste according to the present invention before heating and drying.

Examples of such (B") a heat-resistant resin B" (including a combination with the solvent) may include those resins as disclosed in Table 1 specifically exemplified as (II) heat-resistant resins B in Japanese Provisional Patent Publication No. 246777/1999, a polyamic acid (the solvent is γ-butyrolactone) of 3,4,3',4'-benzophenone tetracarboxylic acid dianhydride/4,4'-diaminodiphenyl ether (1/1; molar ratio), a polyamic acid (the solvent is γ-butyrolactone) of 3,3',4,4'-biphenyltetracarboxylic acid dianhydride/3,4,3',4'-benzophenone tetracarboxylic acid dianhydride/4,4'-diaminodiphenyl ether (0.5/0.5/1; molar ratio), etc. These are one example showing an embodiment of the present invention and the invention is not specifically limited by these.

When stability of (C") the solvent, and solubility and productivity of (B") the heat-resistant resin B" to (C") the solvent are considered, a combination of (B") the heat-resistant resin B" comprising an aromatic polyimide resin obtained by reacting an aromatic tetracarboxylic acid dianhydride containing 50 mol % or more of 3,4,3',4'-benzophenonetetracarboxylic acid dianhydride and an aromatic diamine containing 50 mol % or more of 4,4'-diaminodiphenyl ether, and (C") the solvent of γ-butyrolactone is preferred.

A heating and drying temperature of the heat-resistant resin paste according to the above-mentioned combination is usually 50 to 350° C., and within this range, it is preferred to raising the temperature from a low temperature to a high temperature stepwisely.

Also, (B") the heat-resistant resin B" and (A") the heat-resistant resin A" are preferably used those having compatibility. More specifically, a difference of solubility parameters between (B") the heat-resistant resin B" and (A") the heat-resistant resin A" of preferably 2.0 or less, more preferably 1.5 or less is used in combination. Here, the solubility parameter is a value [unit: $(MJ/m^3)^{1/2}$] calculated according to the system of Fedors described in Polym. Eng. Sci., Vol. 14, pp. 147-154.

As the tetracarboxylic acid dianhydride to be used for preparation of the heat-resistant resin of the present invention, there may be mentioned, for example, pyromellitic acid dianhydride, 3,3',4,4'-biphenyltetracarboxylic acid dianhydride, 2,2',3,3'-biphenyltetracarboxylic acid dianhydride, 2,3,3',4'-biphenyltetracarboxylic acid dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic acid dianhydride, bis(3,4-dicarboxyphenyl)ether dianhydride, benzene-1,2,3,4-tetracarboxylic acid dianhydride, 3,4,3',4'-benzophenonetetracarboxylic acid dianhydride, 2,3,2',3'-benzophenonetetracarboxylic acid dianhydride, 2,3,3',4'-benzophenonetetracarboxylic acid dianhydride, 1,2,5,6-naphthalenetetracarboxylic acid dianhydride, 2,3,6,7-naphthalenetetracarboxylic acid dianhydride, 1,2,4,5-naphthalenetetracarboxylic acid dianhydride, 1,4,5,8-naphthalenetetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronaphthalene-1,4,5,8-tetracarboxylic acid dianhydride, phenanthrene-1,8,9,10-tetracarboxylic acid dianhydride, bis(3,4-dicarboxyphenyl)dimethylsilane dianhydride, bis(3,4-dicarboxyphenyl)

methylphenylsilane dianhydride, bis(3,4-dicarboxyphenyl) diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylbis(trimellitic acid monoester acid anhydride), 2,2-bis(3,4-dicarboxyphenyl)hexafluoropropane dianhydride, 2,2-bis[4-(3,4-dicarboxyphenoxy)phenyl]hexafluoropropane dianhydride, 2,2-bis[4-(3,4-dicarboxyphenoxy)phenyl]propane dianhydride, 4,4-bis(3,4-dicarboxyphenoxy)diphenylsulfide dianhydride, 1,4-bis(2-hydroxyhexafluoroisopropyl)benzene bis(trimellitic anhydride), 1,3-bis(2-hydroxyhexafluoroisopropyl)benzene bis(trimellitic anhydride), 1,2-(ethylene)bis(trimellitate dianhydride), 1,3-(trimethylene)bis(trimellitate dianhydride), 1,4-(tetramethylene)bis(trimellitate dianhydride), 1,5-(pentamethylene)bis(trimellitate dianhydride), 1,6-(hexamethylene)bis(trimellitate dianhydride), 1,7-(heptamethylene)bis(trimellitate dianhydride), 1,8-(octa-methylene)bis(trimellitate dianhydride), 1,9-(nonamethylene)bis(trimellitate dianhydride), 1,10-(decamethylene)bis(trimellitate dianhydride), 1,12-(dodecamethylene)bis(trimellitate dianhydride), 1,16-(hexadecamethylene)bis(trimellitate dianhydride), 1,18-(octadecamethylene)bis(trimellitate dianhydride), etc. These compounds may be used alone or in combination of two or more kinds.

In the above-mentioned aromatic tetracarboxylic acid, a tetracarboxylic acid dianhydride other than the aromatic tetracarboxylic acid dianhydride may be used in the range not exceeding 50 mol % of the aromatic tetracarboxylic acid depending on the purpose.

Such a tetracarboxylic acid dianhydride may include, for example, tetraethylene carboxylic acid dianhydride, 1,2,3,4-butanetetracarboxylic acid dianhydride, pyrazine-2,3,5,6-tetracarboxylic acid dianhydride, thiophene-2,3,4,5-tetracarboxylic acid dianhydride, decahydronaphthalene-1,4,5,8-tetracarboxylic acid dianhydride, 4,8-dimethyl-1,2,3,5,6,7-hexahydronaphthalene-1,2,5,6-tetracarboxylic acid dianhydride, cyclopentane-1,2,3,4-tetracarboxylic acid dianhydride, pyrrolidone-2,3,4,5-tetracarboxylic acid dianhydride, 1,2,3,4-cyclobutane tetracarboxylic acid dianhydride, bis(exo-bicyclo[2.2.1]heptane-2,3-dicarboxylic acid dianhydride, bicyclo[2.2.2]oct(7)-ene-2,3,5,6-tetracarboxylic acid dianhydride, 5-(2,5-dioxotetrahydrofuryl)-3-methyl-3-cyclohexene-1,2-dicarboxylic acid anhydride, tetrahydrofuran-2,3,4,5-tetracarboxylic acid dianhydride, etc.

As the acid anhydride to be used in (A") the heat-resistant resin A" to be used in the present invention, in the viewpoints that a resin film is to be obtained at a relatively low drying temperature without impairing heat-resistance, a trimellitate including 1,4-bis(2-hydroxyhexafluoroisopropyl)benzene bis(trimellitic anhydride), 1,3-bis(2-hydroxyhexafluoro-isopropyl)benzene bis(trimellitic anhydride), 1,2-(ethylene)bis(trimellitate dianhydride), 1,3-(trimethylene)bis(trimellitate dianhydride), 1,4-(tetramethylene)bis(trimellitate dianhydride), 1,5-(pentamethylene)bis(trimellitate dianhydride), 1,6-(hexamethylene)bis(trimellitate dianhydride), 1,7-(heptamethylene)bis(trimellitate dianhydride), 1,8-(octamethylene)bis(trimellitate dianhydride), 1,9-(nonamethylene)bis(trimellitate dianhydride), 1,10-(decamethylene)bis(trimellitate dianhydride), 1,12-(dodeca-methylene)bis(trimellitate dianhydride), 1,16-(hexadeca-methylene)bis(trimellitate dianhydride), 1,18-(octadeca-methylene)bis(trimellitate dianhydride), etc. is preferably used.

As the aromatic diamine, there may be mentioned, for example, o-phenylenediamine, m-phenylenediamine, p-phenylenediamine, 3,3'-diaminodiphenyl ether, 4,4'-diaminodiphenyl ether, 3,4'-diaminodiphenyl ether, 3,3'-diaminodiphenylmethane, 3,4'-diaminodiphenylmethane, 4,4'-diaminodiphenylmethane, 3,3'-diaminodiphenyldifluoromethane, 4,4'-diaminodiphenyldifluoromethane, 3,3'-diaminodiphenylsulfone, 3,4'-diaminodiphenylsulfone, 4,4'-diaminodiphenylsulfone, 3,3'-diaminodiphenylsulfide, 3,4'-diaminodiphenylsulfide, 4,4'-diaminodiphenylsulfide, 3,3'-diaminodiphenyl ketone, 3,4'-diaminodiphenyl ketone, 4,4'-diaminodiphenyl ketone, 2,2-bis(3-aminophenyl)propane, 2,2-bis(3,4-diaminophenyl)propane, 2,2-bis(4-aminophenyl)propane, 2,2-bis(3-aminophenyl)hexafluoropropane, 2,2-bis(3,4-diaminophenyl)hexafluoropropane, 2,2-bis(4-aminophenyl)hexafluoropropane, 1,3-bis(4-aminophenoxy)benzene, 1,4-bis(4-aminophenoxy)benzene, 3,3'-[1,4-phenylenebis(1-methylethylidene)]bis-aniline, 3,4'-[1,4-phenylenebis(1-methylethylidene)]bis-aniline, 4,4'-[1,4-phenylenebis(1-methylethylidene)]bis-aniline, 2,2-bis[4-(3-aminophenoxy)phenyl]propane, 2,2-bis[4-(4-aminophenoxy)phenyl]propane, 2,2-bis[4-(3-aminophinoxy)phenyl]hexafluoropropane, 2,2-bis[4-(4-aminophinoxy)phenyl]hexafluoropropane, bis[4-(3-aminophenoxy)phenyl]sulfide, bis[4-(4-aminophenoxy)phenyl]sulfide, bis-[4-(3-aminophenoxy)phenyl]sulfone, bis [4-(4-aminophenoxy)phenyl]sulfone, 1,2-diamino-4-carboxybenzene, 1,3-diamino-5-carboxybenzene, 1,3-diamino-4-carboxybenzene, 1,4-diamino-5-carboxybenzene, 1,5-diamino-6-carboxybenzene, 1,3-diamino-4,6-dicarboxybenzene, 1,2-diamino-3,5-dicarboxybenzene, 4-(3,5-diaminophenoxy)benzoic acid, 3-(3,5-diaminophenoxy)benzoic acid, 2-(3,5-diaminophenoxy)benzoic acid, 3,3'-dicarboxy-4,4'-diaminobiphenyl, 3,3'-diamino-4,4'-dicarboxybiphenyl, 2,2-bis(4-carboxy-3-aminophenyl)propane, 2,2-bis(4-carboxy-3-aminophenyl)hexafluoropropane, bis(4-carboxy-3-aminophenyl)ketone, bis(4-carboxy-3-aminophenyl)sulfide, bis(4-carboxy-3-aminophenyl)ether, bis(4-carboxy-3-aminophenyl)sulfone, bis(4-carboxy-3-aminophenyl)methane, 4-[(2,4-diamino-5-pyrimidinyl)methyl]benzoic acid, p-(3,6-diamino-s-triazin-2-yl)benzoic acid, 2,2-bis(4-amino-3-carboxyphenyl)propane, 2,2-bis(4-amino-3-carboxyphenyl)hexafluoropropane, bis(4-amino-3-carboxyphenyl) ketone, bis(4-amino-3-carboxyphenyl)sulfide, bis(4-amino-3-carboxyphenyl) ether, bis(4-amino-3-carboxyphenyl)sulfone, bis(4-amino-3-carboxyphenyl)methane, bis(4-amino-3-carboxyphenyl)difluoromethane, 1,2-diamino-4-hydroxybenzene, 1,3-diamino-5-hydroxybenzene, 1,3-diamino-4-hydroxybenzene, 1,4-diamino-6-hydroxybenzene, 1,5-diamino-6-hydroxybenzene, 1,3-diamino-4,6-dihydroxybenzene, 1,2-diamino-3,5-dihydroxybenzene, 4-(3,5-diaminophenoxy)phenol, 3-(3,5-diaminophenoxy)phenol, 2-(3,5-diaminophenoxy)phenol, 3,3'-dihydroxy-4,4'-diaminobiphenyl, 3,3'-diamino-4,4'-dihydroxybiphenyl, 2,2-bis(4-hydroxy-3-aminophenyl)propane, 2,2-bis(4-hydroxy-3-aminophenyl)hexafluoropropane, bis(4-hydroxy-3-aminophenyl)ketone, bis(4-hydroxy-3-aminophenyl)sulfide, bis(4-hydroxy-3-aminophenyl)ether, bis(4-hydroxy-3-aminophenyl)sulfone, bis(4-hydroxy-3-aminophenyl)methane, 4-[(2,4-diamino-5-pyrimidinyl)methyl]phenol, p-(3,6-diamino-s-triazin-2-yl)phenol, bis(4-hydroxy-3-aminophenyl)-difluoromethane, 2,2-bis(4-amino-3-hydroxyphenyl)propane, 2,2-bis(4-amino-3-hydroxyphenyl)hexafluoropropane, bis(4-amino-3-hydroxyphenyl)ketone, bis(4-amino-3-hydroxyphenyl)sulfide, bis(4-amino-3-hydroxyphenyl)ether, bis(4-amino-3-hydroxyphenyl)sulfone, bis(4-amino-3-hydroxyphenyl)methane, bis(4-amino-3-hydroxyphenyl)difluoromethane,

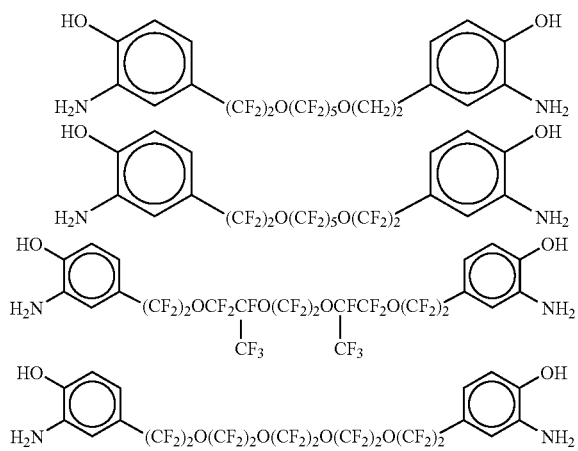

etc., and the above-mentioned aromatic diamine may be used in combination of two or more kinds.

For producing the polyimide type resin, as the diamine compound other than the above-mentioned aromatic diamines, a diamine compound including an aliphatic diamine such as 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,3-bis(3-aminopropyl)tetramethyldisiloxane, 1,3-bis(3-aminopropyl)tetramethylpolysiloxane, etc., and diaminosiloxane, etc. may be used. In the viewpoint of heat-resistance, an amount of these diamines is preferably 50% by weight or less based on the total amount of the diamine compound.

In the preparation of the polyimide resin to be used in the present invention, the aromatic tetracarboxylic acid dianhydride and the diamine compound are preferably reacted by using substantially the same molar amounts in the point of the film property.

To make control of the end point of the reaction easy and to obtain a polyimide resin having a desired molecular weight, it is preferred to use either of the acid component or the amine component with a slightly excess amount (1.01 to 1.10 or so) in formulation molar amount. Or else, as a terminal sealing agent for the acid component or the amine component, there may be added, for example, a tricarboxylic acid monoanhydride such as maleic anhydride, phthalic anhydride, tetrahydrophthalic anhydride, etc., or a monoamine such as aniline, benzylamine, etc., in an amount of 0.01 to 0.10 mol per mole of either of the components of the acid component or the amine component.

A molecular weight of the polyimide resin to be used in the present invention is preferably in a number average molecular weight of 5,000 to 80,000. If it is less than 5,000, mechanical properties tend to be lowered, while if it exceeds 80,000, a viscosity of the reaction mixture during the synthesis thereof becomes too high so that workability tends to be lowered.

The number average molecular weight is a calculated value based on the molecular weight of standard polystyrene obtained from the gel permeation chromatography method using a calibration curve of polystyrenes the molecular weights of which had been known. For example, it can be measured by the following conditions. The values in Examples mentioned hereinbelow are measured by the following conditions.

Device: Hitachi Type 655A
Column: Gelpak GL-S300, MDT-S (300 mm×8 mmφ), 2 columns, manufactured by Hitachi Chemical Co., Ltd.
Eluent: Tetrahydrofuran/dimethylformamide=1/1 (volume), $H_3PO_4$ (0.06 mol/liter)/$LiBr.H_2O$ (0.03 mol/liter)
Flow amount: 1 ml/min
Detector: UV (270 nm)

The reaction of the aromatic tetracarboxylic acid dianhydride and the diamine compound is carried out in an organic solvent. As the organic solvent, there may be mentioned, for example, a nitrogen-containing compound such as N-methylpyrrolidone, dimethylacetamide, dimethylformamide, 1,3-dimethyl-3,4,5,6-tetrahydro-2(1H)-pyrimidinone, 1,3-dimethyl-2-imidazolidinone, etc.; a sulfur compound such as sulforane, dimethylsulfoxide, etc.; a lactone such as γ-butyrolactone, γ-valerolactone, γ-caprolactone, γ-heptalactone, α-acetyl-γ-butyrolactone, ε-caprolactone, etc.; an ether such as dioxane, 1,2-dimethoxyethane, diethylene glycol dimethyl (or diethyl, dipropyl, dibutyl) ether, triethylene glycol dimethyl (or diethyl, dipropyl, dibutyl) ether, tetraethylene glycol dimethyl (or diethyl, dipropyl, dibutyl) ether, etc.; a ketone such as methyl ethyl ketone, methyl isobutyl ketone, cyclohexanone, acetophenone, etc.; an alcohol such as butanol, octyl alcohol, ethylene glycol, glycerin, diethylene glycol monomethyl (or monoethyl) ether, triethylene glycol monomethyl (or monoethyl) ether, tetraethylene glycol monomethyl (or monoethyl) ether, etc.; a phenol such as phenol, cresol, xylenol, etc.; an ester such as ethyl acetate, butyl acetate, ethyl cellosolve acetate ("cellosolve" is trade name), butyl cellosolve acetate ("cellosolve" is trade name), etc., a hydrocarbon such as toluene, xylene, diethylbenzene, cyclohexane, etc.; a halogenated hydrocarbon such as trichloroethane, tetrachloroethane, monochlorobenzene, etc.

These organic solvents are used alone or in combination of two or more kinds. When solubility, low hygroscopic property, low temperature curing property and environmental safety, etc., are considered, it is preferred to use a lactone, an ether or a ketone.

A reaction temperature is usually 80° C. or less, preferably 0 to 60° C. In progress with the reaction, a viscosity of the reaction mixture gradually increases. In this case, a polyamic acid which is a precursor of the polyimide resin is formed.

The polyimide resin can be also obtained by subjecting the above-mentioned reaction product (the polyimide precursor) to dehydration and cyclization. The dehydration and cyclization can be carried out by the method of subjecting to heat treatment at 120° C. to 250° C. (heat imidation) or the method of using a dehydrating agent (chemical imidation). In the case of the method of subjecting to heat treatment at 120° C. to 250° C., it is preferably carried out by removing water generated by the dehydration reaction out of the system. At this time, water may be removed by azeotropic distillation by using benzene, toluene, xylene, etc.

In the method of subjecting to dehydration and cyclization by using a dehydrating agent, a carbodiimide compound such as dicyclohexylcarbodiimide, etc., is preferably used. At this time, if necessary, a dehydrating catalyst such as pyridine, isoquinoline, trimethylamine, aminopyridine, imidazole, etc., may be used. The dehydrating agent or the dehydrating catalyst is preferably used in an amount in the range of each 1 to 8 mol based on 1 mol of the aromatic tetracarboxylic acid dianhydride.

To reduce the number of production steps and to heighten economical merit, the method of subjecting to heat treatment at 120° C. to 250° C. (heat imidation) is preferred.

The polyamide imide resin or a precursor thereof in the present invention can be produced by using a trivalent tricarboxylic acid anhydride or a derivative thereof such as a trimellitic acid anhydride derivative including trimellitic anhydride or a chloride of the trimellitic anhydride, etc., in place of part or whole part of the aromatic tetracarboxylic acid dianhydride in the production of the above-mentioned polyimide resin or a precursor thereof. Also, it can be produced by using an aromatic diisocyanate in place of the aromatic diamine. As the aromatic diisocyanate which can be used, a compound obtained by reacting the above-mentioned aromatic diamine and phosgene or thionyl chloride.

Also, as the polyamide imide resin in the present invention, a polyamide imide resin obtained by reacting an aromatic tetracarboxylic acid dianhydride and a diamine compound containing dihydrazide isophthalate as an essential component is preferably used. As the aromatic tetracarboxylic acid and the diamine compound other than dihydrazide isophthalate, those as mentioned above may be used. A ratio of the diamine compound in the dihydrazide isophthalate is preferably 1 to 100 mol %. If it is less than 1 mol %, when the resin paste of the present invention is used as an adhesive of a semiconductor device, solvent resistance to an encapsulating agent tends to be lowered, while if an amount of the dihydrazide isophthalate is too much, humidity resistance of an adhesive layer formed by the resin paste of the present invention tends to be lowered. Thus, it is preferably 10 to 80 mol %, particularly preferably 20 to 70 mol %. This polyamide imide resin can be obtained by the same method as those of the synthesis of the above-mentioned polyimide resin under the conditions such as the formulation ratio of the aromatic tetracarboxylic acid dianhydride and the diamine compound, the organic solvent to be used and the synthesis method, etc.

The polyamide resin in the present invention can be produced by reacting the aromatic dicarboxylic acid such as terephthalic acid, isophthalic acid, phthalic acid, etc., a derivative thereof such as dichloride, anhydride, etc., and the aromatic diamine or aromatic diisocyanate with the formulation as mentioned above.

As the solvent (C") to be used in the present invention, solvents described in, for example "Solvent Handbook" (published by Kodansha, published in 1976), pp. 143-852, can be used.

As the organic solvent, there may be mentioned, for example, a nitrogen-containing compound such as N-methylpyrrolidone, dimethylacetamide, dimethylformamide, 1,3-dimethyl-3,4,5,6-tetrahydro-2(1H)-pyrimidinone, 1,3-dimethyl-2-imidazolidinone, etc.; a sulfur compound such as sulforane, dimethylsulfoxide, etc.; a lactone such as γ-butyrolactone, γ-valerolactone, γ-caprolactone, γ-heptalactone, α-acetyl-γ-butyrolactone, ε-caprolactone, etc.; an ether such as dioxane, 1,2-dimethoxyethane, diethylene glycol dimethyl (or diethyl, dipropyl, dibutyl) ether, triethyleneglycol dimethyl (or diethyl, dipropyl, dibutyl) ether, tetraethyleneglycol dimethyl (or diethyl, dipropyl, dibutyl) ether, etc.; a carbonate such as ethylene carbonate, propylene carbonate, etc.; a ketone such as methyl ethyl ketone, methyl isobutyl ketone, cyclohexanone, acetophenone, etc.; an alcohol such as butanol, octyl alcohol, ethylene glycol, glycerin, diethylene glycol monomethyl (or monoethyl) ether, triethylene glycol monomethyl (or monoethyl) ether, tetraethylene glycol monomethyl (or monoethyl) ether, etc.; a phenol such as phenol, cresol, xylenol, etc.; an ester such as ethyl acetate, butyl acetate, ethyl cellosolve acetate, butyl cellosolve acetate, etc., a hydrocarbon such as toluene, xylene, diethylbenzene, cyclohexane, etc.; a halogenated hydrocarbon such as trichloroethane, tetrachloroethane, monochlorobenzene, etc. These solvents may be used alone or in combination.

The boiling point of (C") the solvent is preferably 100° C. or higher, particularly preferably 150 to 300° C. when a usable time of a paste at the time of effecting screen printing is considered.

Also, when stability to hygroscopicity of a paste is considered, (C") the solvent preferably used is a lactone such as γ-butyrolactone, γ-valerolactone, γ-caprolactone, γ-heptalactone, α-acetyl-γ-butyrolactone, ε-caprolactone, etc.; an ether such as dioxane, 1,2-dimethoxyethane, diethylene glycol dimethyl (or diethyl, dipropyl, dibutyl) ether, triethylene glycol dimethyl (or diethyl, dipropyl, dibutyl) ether, tetraethylene glycol dimethyl (or diethyl, dipropyl, dibutyl) ether, etc.; a carbonate such as ethylene carbonate, propylene carbonate, etc.; a ketone such as methyl ethyl ketone, methyl isobutyl ketone, cyclohexanone, acetophenone, etc.

The heat-resistant paste of the present invention can be prepared by, for example, mixing the heat-resistant resin A" of (A"), the heat-resistant resin B" of (B") and the solvent of (C"), heating the mixture to dissolve the resins and cooling the solution, whereby fine particles of the heat-resistant resin B" of (B") are precipitated and dispersed in the solvent of (C").

A temperature at the time of heating and dissolution, it is not particularly limited so long as the mixture of the heat-resistant resin A" of (A"), the heat-resistant resin B" of (B") and the solvent of (C") becomes substantially uniform and transparent solution, and is generally 40° C. to 250° C. under stirring. A time required for the dissolution is optional and preferably 0.1 to 5 hours, more preferably 1 to 5 hours.

Then, the conditions for cooling the solution dissolved by heating are not specifically limited so long as the heat-resistant resin B" of (B") becomes fine particles in the mixed solution of the heat-resistant resin A" of (A") and the solvent of (C") and precipitates and disperses therein. It is generally −20° C. to 100° C. which is less than the temperature at dissolution under heating, and the procedure is preferably carried out under the conditions of stirring or allowed to stand for one hour to 60 days. As the cooling conditions to make fine particles within a short period of time, it is preferably carried out under the conditions of stirring at a constant temperature between 0° C. to 80° C. and allowed to stand for 5 to 80 hours. A rate of cooling from the temperature at which the mixture is dissolved under heating to cool to −20° C. to 100° C. is optional but rapid cooling likely causes aggregation of the precipitating fine particles so that it is, in general, preferably carried out, under stirring, by cooing at a rate of 0.1 to 10° C./min. A production atmosphere is preferably an inert gas atmosphere such as a dried nitrogen gas, etc.

Also, the heat-resistant resin paste of the present invention can be produced by, for example, charging starting materials constituting the heat-resistant resin B" of (B") in a mixed solution of the heat-resistant resin A" of (A") and the solvent of (C"), after dissolving the resin, reacting the materials in the solution of the heat-resistant resin A" of (A") and the solvent of (C") at a temperature at which the heat-resistant resin B" of (B") is not precipitated to synthesize the heat-resistant resin B" of (B"), and then, cooling the mixture to precipitate and disperse the heat-resistant resin B" of (B") in the solution of the heat-resistant resin A" of (A") and the solvent of (C") . As the starting materials constituting the heat-resistant resin B" of (B"), the above-mentioned materials can be used.

Also, the heat-resistant resin paste of the present invention can be produced by, for example, charging starting materials constituting the heat-resistant resin A" of (A") in a mixed solution of the heat-resistant resin B" of (B") and the solvent of (C"), after dissolving the resin, reacting the materials in the solution of the heat-resistant resin B" of (B") and the solvent of (C") at a temperature at which the heat-resistant resin A" of (A") is not precipitated to synthesize the heat-resistant resin A" of (A"), and then, cooling the mixture to precipitate and disperse the heat-resistant resin B" of (B") in the solution of the heat-resistant resin A" of (A") and the solvent of (C") . As the starting materials constituting the heat-resistant resin A" of (A"), the above-mentioned materials can be used.

(D) The particle or liquid material having rubber elasticity of the present invention is not particularly limited so long as it is particles or a liquid material having rubber elasticity, and there may be mentioned particles or a liquid material having rubber elasticity such as acrylic rubber, fluorine rubber, silicone rubber, butadiene rubber, etc. Of these, particles having rubber elasticity mainly comprising silicone rubber are preferably used.

These rubber elastomers are preferably fine particles with sphere or amorphous shape having an average particle size of 0.1 to 50 μm. The average particle size can be measured by an electron microscopic method, particle analyzer method, etc. If the average particle size is less than 0.μm, aggregation between particles occurs, sufficient dispersion cannot be carried out and stability of the paste with a lapse of time tends to be lowered. Also, if it exceeds 50 μm, the surface of the coated film becomes rough and a uniform coated film cannot be obtained.

The surface of the particles having rubber elasticity to be used in the present invention may be the rubber elastic material itself, that coated by a resin, and preferably that chemically modified by a functional group such as an epoxy group, etc. A material which is chemically modified by a functional group such as an amino group, an acrylic group, a phenyl group, etc., in place of the above-mentioned epoxy group may be used. By adding these particles having rubber elasticity to the heat-resistant resin, it is possible to control a modulus of elasticity without impairing heat-resistance and adhesiveness of the resin.

The particles having rubber elasticity are commercially available from Dow Corning Toray Silicone Co., Ltd., Japan under the trade names of TREFIL E-601, TREFIL E-600, etc., Shin-Etsu Chemical Industry, Japan, under the trade names of Silicone rubber powder KMP594, KMP598, etc., and Silicone complex powder KMP600, KMP605, etc.

Also, in the present invention, the resin film obtained from the heat-resistant resin paste can be optionally controlled the modulus of elasticity thereof in the range of 0.2 to 3.0 GPa, and the heat-resistant resin paste preferably has the modulus of elasticity at 150° C. of 10 to 100% to that at −65° C. If it exceeds 3.0 GPa, stress relaxation becomes insufficient and crack, etc, occurs at the connecting portion of solder, etc. whereby reliability tends to be impaired, while if it is less than 0.2 GPa, a wiring layer tends to be broken by strain. If the modulus of elasticity at 150° C. is less than 10% to that at −65° C., strain likely occurs at solder ball connecting portion, etc. by the cold-heat impact cycle test whereby reliability is lowered.

Also, in the present invention, the resin film obtained from the heat-resistant resin paste has a glass transition temperature of 180° C. or higher, and the heat-resistant resin paste preferably has a 5% weight loss temperature of 300° C. or higher. If the glass transition temperature is less than 180° C., or the 5% weight loss temperature is less than 300° C., the resin tends to be decomposed in the sputtering step, etc.

Also, in the present invention, the heat-resistant resin paste preferably has a viscosity of 10 to 1,000 Pa·s, and a thixotropic coefficient of 1.2 or higher.

By making the thixotropic coefficient to 1.2 or higher, good screen printing property can be obtained. If the thixotropic coefficient is less than 1.2, sufficient printing property or resolution can be difficultly obtained. The thixotropic coefficient is more preferably 2.0 to 10.0. If it exceeds 10.0, a formed pattern tends to cause thin spot.

Also, the viscosity is preferably made 10 Pa·s to 1,000 Pa·s. If it is less than 10 Pa·s, sufficient film thickness and resolution can be difficultly obtained, while if it exceeds 1,000 Pa·s, workability at the time of forming a pattern tends to be lowered. It is more preferably 50 Pa·s to 700 Pa·s, particularly preferably 100 Pa·s to 600 Pa·s. Here, the thixotropic coefficient is measured by using an E type viscometer (manufactured by TOKIMEC INC., Japan, Type EHD-U) with a sample amount of 0.4 g and a measurement temperature of 25° C. It is shown by a ratio of an apparent viscosity $\eta 1$ at a rotation number of 1 min$^{-1}$ and $\eta 10$ at a rotation number of 10 min$^{-1}$, $\eta 1/\eta 10$. The viscosity is shown by an apparent viscosity $\eta 0.5$ at a rotation number of 0.5 min$^{-1}$. The viscosity can be controlled by, for example, a solid component concentration of the resin past and an amount of (B") the heat-resistant resin B". When these values are larger, the viscosity also become higher.

In the present invention, the modulus of elasticity of the resin film obtained by combining (A") the heat-resistant resin A" which is soluble in a solvent at room temperature and a temperature at the time of heating and drying, (B") the heat-resistant resin B" which does not dissolve in a solvent at room temperature but dissolve at a temperature at the time of heating and drying, and (D) particles or a liquid material D showing rubber elasticity can be controlled optionally in the range of 0.2 to 3.0 GPa and the modulus of elasticity at 150° C. can be made a size of 10 to 100% that at −65° C.

Moreover, the resin film obtained by the heat-resistant resin paste of the present invention has a glass transition temperature of 180° C. or higher, and a 5% weight loss temperature of 300° C. or higher so that it has excellent resistances to the processes such as sputtering, plate resist formation, electroplating or electroless plating, resist removal, thin film metal etching, solvent treatment, solder ball mounting, etc. which are used when preparing a semiconductor device.

A formulation ratio of the heat-resistant resin A" of (A"), the heat-resistant resin B" of (B"), the solvent of (C") and the particles or liquid material showing rubber elasticity of (D) is preferably, based on 100 parts by weight of the heat-resistant resin A" of (A"), 10 to 300 parts by weight of the heat-resistant resin B" of (B"), 100 to 3,000 parts by weight of the solvent of (C"), and 10 to 700 parts by weight of the particles or liquid material showing rubber elasticity of (D), more preferably 20 to 200 parts by weight of the heat-resistant resin B" of (B"), 150 to 2,000 parts by weight of the solvent of (C"), and 20 to 400 parts by weight of the particles or liquid material showing rubber elasticity of (D), and particularly preferably 20 to 200 parts by weight of the heat-resistant resin B" of (B"), 200 to 1,000 parts by weight of the solvent of (C"), and 20 to 200 parts by weight of the particles or liquid material showing rubber elasticity of (D).

If the amount of the heat-resistant resin B" of (B") is less than 10 parts by weight, thixotropic property is insufficient at the time of forming a pattern by screen printing or dispense, etc., and resolution tends to be lowered. Also, if it exceeds 300 parts by weight, fluidity of the paste is impaired so that printing property or dispense property tends to be lowered.

If the amount of the solvent of (C") is less than 100 parts by weight, fluidity of the paste is impaired so that printing property or dispense property tends to be lowered. Also, if it exceeds 3,000 parts by weight, a viscosity of the paste becomes low so that formation of a thick film becomes difficult whereby resolution tends to be impaired.

If the amount of the particles or liquid material showing rubber elasticity of (D) is less than 5 parts by weight, elasticity of the heat-resistant resin film becomes high and stress-releasing capability tends to be impaired. Also, if an amount of the particles or liquid material showing rubber elasticity of (D) exceeds 700 parts by weight, mechanical properties of the coated film is lowered so that a function as the coated film tends to be lowered.

The heat-resistant resin paste of the present invention can be prepared, if desired, by making a paste in which fine particles of the heat-resistant resin B" of (B") are dispersed in the solution of the heat-resistant resin A" of (A") and the solvent of (C"), and then, adding 1 to 30 parts by weight of a cross-linking agent having a functional group capable of bonding to a hydroxyl group or a carboxyl group based on the total amount of the heat resistant resin paste as 100 parts by weight.

As the a cross-linking agent having a functional group capable of bonding to a hydroxyl group or a carboxyl group, preferably used is a material having two or more functional groups in the molecule, at least one of which reacts with the heat-resistant resin having the hydroxyl group or carboxyl group in the molecular main chain and the remaining functional groups react with the heat-resistant resin having the hydroxyl group or carboxyl group in the molecular main chain or react with the other functional group. The molecular structure or the molecular weight, etc., are not specifically limited so long as it has two or more functional groups.

As the functional group reactive with the hydroxyl group, there may be mentioned, for example, an epoxy resin, an isocyanate group, a methylol group, etc. As the functional group reactive with the carboxyl group, there may be mentioned, for example, an epoxy group, an amino group, a vinyl group, an oxazoline group, an ethoxysialne group, etc. A coupling agent which can give gentle cross-linking structure to the cured product of the heat-resistant resin paste and excellent in preservation stability to the heat-resistant resin paste is preferably used. As the coupling agent, there may be mentioned, for example, a silane coupling agent, a titanate type coupling agent, an aluminum type coupling agent, etc. Of these, a silane coupling agent is preferably used.

As the silane coupling agent, there may be mentioned, for example, γ-(2-aminoethyl)aminopropyltrimethoxysilane, γ-(2-aminoethyl)aminopropylmethyldimethoxysilane, γ-methacryl-oxypropyltrimethoxysilane, γ-glycidoxypropyltrimethoxysilane, γ-mercaptopropyltrimethoxysilane, vinyltriacetoxysilane, γ-anilinopropyltrimethoxysilane, vinyltrimethoxysilane, γ-mercaptopropylmethyldimethoxysilane, γ-glycidoxypropylmethyldimethoxysilane, γ-ureidopropyltriethoxysilane, γ-methacryloxypropylmethylenedimethoxysilane, etc.

A silane coupling agent having an epoxy group and a methoxysilane group in the molecule is preferably used to the heat-resistant resin having a hydroxyl group in the molecule, more preferably γ-glycidoxypropyltrimethoxysilane is used. In the heat-resistant resin paste obtained by such a combination, its curing product by heating has a gentle cross-linking structure so that when it is used for a resin encapsulation type semiconductor device, it is not melted by a encapsulating material-constituting resin under a molding temperature whereby it is excellent in solder resistant reflow property.

In the present invention, the aromatic thermoplastic resin which is insoluble in a polar solvent at room temperature but is soluble under heating gives thixotropy to the resin composition whereby a precise pattern can be formed by a screen printing and dispense coating.

In the present invention, it is preferred that a modulus of elasticity at 25° C. can be controlled in the range of 0.2 to 3.0 GPa, and the modulus of elasticity at 150° C. is in the range of 10 to 100% to that at −65° C.

In the present invention, a glass transition temperature (Tg) is preferably 180° C. or higher and a thermal decomposition temperature is preferably 300° C. or higher.

In the resin composition of the present invention, it is preferred that a viscosity is within the range of 1 to 1000 Pa·s, a thixotropic coefficient is 1.2 or more and a precise pattern can be formed.

If the viscosity of the resin composition is less than 1 Pa·s, a shape of the resin composition at printing cannot be maintained, and stringing of the resin composition becomes remarkable whereby printing is difficult. Also, if it exceeds 1000 Pa·s, the resin composition becomes hard and handling at printing becomes extremely difficult and there is a problem that formation of a precise pattern becomes difficult. Also, the thixotropic coefficient is preferably within the range of 1.2 to 20, more preferably in the range of 1.5 to 15. If the thixotropic coefficient is less than 1.2, even when a precise pattern is formed, the shape is degenerated whereby formation of a precise pattern tends to be difficultly formed.

A method of obtaining a precise pattern by the resin composition of the present invention and a method of obtaining a resin film pattern using the heat-resistant resin paste of the same are not specifically limited, and, there may be mentioned, for example, screen printing method, dispense coating method, potting method, curtain coating method, letter press printing method, intaglio printing method, lithographic printing method, etc.

A semiconductor device using the resin composition of the present invention or a semiconductor device using a resin film obtained from the heat-resistant resin paste of the same can be obtained by coating or adhering the resin composition or the heat-resistant resin paste of the present invention to a substrate or a lead frame, and adhering a chip. For example, it can be produced by coating the resin composition or the heat-resistant resin paste of the present invention on the surface of a semiconductor part and drying it to form a protective film. After coating or adhering the resin composition or the heat-resistant resin paste of the present invention on the surface of a chip, it may be adhered to the substrate or the lead frame. Coating and drying can be carried out by the conventionally known methods. At this time, a coated film can be obtained only by a step of heating at 250° C. or lower or a step of drying a solvent at 250° C. or lower without accompanying imidation. A glass transition temperature of the formed coated film is 180° C. or higher and a thermal decomposition temperature is 300° C. or higher so that it has sufficient heat resistance. Also, the modulus of elasticity of the coated film can be controlled within the range of 0.2 to 3.0 GPa so that it can be applied to any kinds of semiconductor devices.

A semiconductor device using the resin composition or the heat-resistant resin paste of the present invention can be produced by the steps of forming at least one resin layer by coating the resin composition or the heat-resistant resin paste of the present invention on a semiconductor substrate on which a plural number of wirings with the same structure have been formed and drying to form at least one resin layer; forming re-wiring on the resin layer which is electrically connected to an electrode on the semiconductor substrate; forming a protective layer on the re-wiring; forming an outer electrode terminal to the protective layer; and then, subjecting to dicing, if necessary.

A substrate for the above semiconductor device is not particularly limited, and there may be mentioned, for example, a silicon wafer on which a memory circuit is formed, a silicon wafer on which a logic circuit is formed, etc. A coating method of the above-mentioned resin layer is not particularly limited and screen printing or dispense coating is preferred.

In the present invention, a drying method of the resin layer can be carried out by the conventionally known method. At this time, a resin layer can be obtained only by a heating step at 250° C. or lower or by a drying step of a solvent at 250° C. or lower without accompanying with imidation. According to this procedure, a resin layer can be formed on a substrate on which a wiring is formed without causing any damage. It is preferred to have heat resistance that a glass transition temperature Tg of the formed resin layer is 180° C. or higher and a thermal decomposition temperature is 300° C. or higher. Also, a 5% weight loss temperature is 300° C. or higher and it has sufficient heat-resistance. Moreover, it has sputtering resistance, plating resistance, alkali resistance, etc., which are required in the step of forming re-wiring. Since a modulus of elasticity of the resin layer can be optionally controlled in the range of 0.2 to 3.0 GPa, so that it can be applied to any kinds of semiconductor devices. Accordingly, a warpage amount of a silicon wafer can be reduced. A semiconductor device produced by this method is expected to be improved in yield and it is possible to improve productivity.

Next, the resin for insulating a semiconductor, the semiconductor device using the same and the process for producing the same will be explained.

The method of producing a semiconductor device according to the present invention comprises a step of forming a plural number of resin layers on a semiconductor substrate on which a wiring (pattern) has been formed; a step of forming, on the resin layer, a second wiring layer electrically connected to an electrode on the semiconductor substrate; a step of forming a protective layer on the second wiring layer except for a portion to which an outer electrode terminal is mounted; and a step of forming the outer electrode terminal on the second wiring layer.

The method of producing a semiconductor device according to the present invention also comprise a step of forming a resin layer on a semiconductor substrate on which a first wiring layer has been formed; a step of providing a through hole(s) at part of the resin layer penetrating to the first wiring layer; and a step of forming a second wiring layer on the resin layer by which an outer connection terminal and the first wiring layer are electrically connected to each other.

The method of producing a semiconductor device according to the present invention further comprise a step of forming a plural number of resin layers on a semiconductor wafer on which an electronic circuit (a first wiring layer) has been formed by printing a resin having an elasticity at 25° C. of 0.2 to 3.0 GPa, a glass transition temperature of 180° C. or higher and a 5% weight-loss temperature of 300° C. or higher; a step of forming a second wiring layer on the resin layer which is electrically connected to an electrode on the semiconductor wafer; a step of forming a plural number of protective layers of the second wiring layer by printing the above resin on the second wiring layer; a step of providing a through hole(s) at the protective layer of the second wiring layer penetrating to of the second wiring layer; and a step of forming an outer electrode terminal to the through hole(s); and a step of cutting the semiconductor wafer to obtain respective semiconductor devices.

Next, preferred embodiment of the present invention is explained by referring to the drawings. FIG. 1 is a sectional view showing preparation steps of a semiconductor device to explain one example of the present invention.

FIG. 1(a) is a drawing showing a general structure of a semiconductor wafer. A semiconductor wafer 3 of the present invention is not particularly limited so long as it is formed thereon an electronic circuit or a semiconductor element, and any kinds or sizes of semiconductor wafers may be used. For example, there may be mentioned a semiconductor wafer on which a memory circuit is formed, a semiconductor wafer on which a logic circuit is formed, etc. On the upper surface of the semiconductor wafer 3, there is an electrode pad 5, and it may be an electrode pad constituted by aluminum or produced by gold plating. Moreover, on the upper surface of the semiconductor wafer 3, an insulating layer such as a polyimide film 4 is formed. This polyimide film 4 may be a nitride film such as silicon nitride, aluminum nitride, etc., without any specific problem. The position of the polyimide film 4 to be formed is preferably a position covering at least an electronic circuit on the semiconductor wafer 3, more preferably a position excluding a dicing area 8 which is finally to cut the semiconductor wafers to the respective semiconductor devices.

Figure 1B:
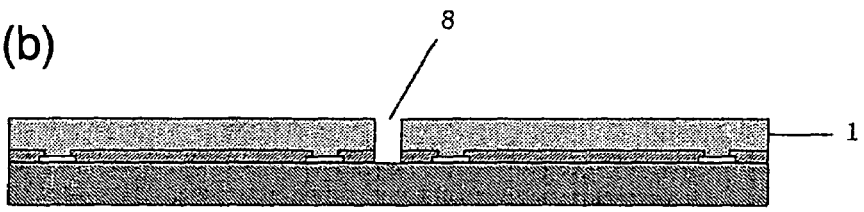

FIG. 1(b) is a drawing in which a resin layer 1 is formed on the semiconductor wafer 3. A kind of the resin for forming the resin layer 1 is not specifically limited so long as it is capable of subjecting to printing, and there may be mentioned, for example, an epoxy resin, a silicone resin, a phenol resin, a polyimide resin, a polyamide imide resin, etc.

A modulus of elasticity of the resin for forming the resin layer 1 is required to be 0.2 to 3.0 GPa. If the modulus of elasticity of the resin exceeds 3.0 GPa, a stress caused by the difference in thermal expansion coefficients between the semiconductor chip and the substrate on which the semiconductor device is practically mounted cannot sufficiently be relaxed by the resin layer 1 so that crack, etc. occurs at the connecting portion such as solder, etc. whereby reliability of the semiconductor device cannot be ensured. Also, if the modulus of elasticity of the resin is less than 0.2 GPa, based on the difference in thermal expansion coefficients between the semiconductor chip and the substrate on which the semiconductor device is practically mounted, a second wiring layer 6 formed on the resin layer 1 at the edge portion of the resin layer 1 likely accepts strain repeatedly so that line breakage sometimes occurs. Thus, it is preferably 0.2 to 1.0 GPa. Adjustment of the modulus of elasticity of the resin layer can be accomplished by formulating a filler, or by using a resin having high elasticity as a main component of the resin layer like the resin as mentioned above and formulating a resin having a low modulus of elasticity therein and changing the formulation ratio thereof.

The resin for insulating the semiconductor of the present invention is characterized in that the modulus of elasticity at 25° C. of the resin layer is 0.2 to 3.0 GPa, and the modulus of elasticity of the above-mentioned resin layer at 150° C. is a size of 10 to 100% to the modulus of elasticity of the same at −65° C., and preferably a glass transition temperature of the resin layer is 180° C. or higher. As the resin for forming the resin layer, there may be mentioned the above-mentioned resin composition and the heat-resistant resin paste.

The resin having a low modulus of elasticity is preferably rubber or elastomer such as an acryl, fluorine rubber, butadiene rubber, silicone, etc., and they are particularly preferably in the shape of particles.

Here, the modulus of elasticity is a storage modulus of elasticity and measured by a viscoelastic spectrometer. In the present invention, it is measured by using a viscoelasticity analyzer RSAII manufactured by Rheometric Scientific F.E. K.K., with a temperature raising rate of 5° C./min and a frequency of 1 Hz.

At an edge portion of the resin layer to be formed on the semiconductor substrate, the maximum value of an angle formed by a plane surface portion of the semiconductor substrate and a tangent line of the resin layer surface to the thickness direction of the edge portion of the resin layer is preferably 45° or less, particularly preferably 5° or more to 30° or less. If the maximum value of the above-mentioned angle exceeds 45°, formation of a second wiring layer by sputtering, deposition or plating, etc., on the resin layer becomes difficult.

A modulus of elasticity of the resin layer 1 at 150° C. is required to be a size of 10 to 100% to a modulus of elasticity of the same at −65° C. If it is less than 10%, for example, when a semiconductor device is subjected to a temperature cycle from −65 to 150° C. repeatedly, the modulus of elasticity of the resin layer becomes rapidly large at a low temperature so that non-elastic strain likely occurs at the connecting portion such as a solder ball, etc., whereby reliability is lowered. Thus, it is preferably 50 to 90%.

A glass transition temperature of the resin forming the resin layer 1 is preferably 180° C. or higher. If the glass transition temperature of the resin layer is less than 180° C., for example, in a step of forming a second wiring layer 6 on the resin layer by sputtering, etc., the resin is exposed to a high temperature so that there is a problem that the resin is thermally decomposed. The glass transition temperature is more preferably 200° C. or higher.

A 5% weight loss temperature of the resin forming the resin layer 1 is preferably 300° C. or higher. If the 5% weight loss temperature is less than 300° C., for example, in a step of forming a second wiring layer 6 by sputtering, etc., the resin is exposed to a high temperature so that there is a problem that the resin is thermally decomposed.

Moreover, it is preferred that a drying or curing temperature of the resin is 250° C. or less since deterioration of the characteristics of the semiconductor device becomes small.

The resin to be used in the present invention is preferably in the form of a resin paste which is capable of coating it by printing or dispense and drying and curing to form a resin layer in the step of forming a plural number of resin layers since formation of the resin layer is easy. Also, it is preferred that a viscosity of the resin paste is 1 to 1000 Pa·s and a thixotropic coefficient of the above-mentioned resin paste is 1.2 to 10.0. here, the thixotropic coefficient (TI value) is shown by a ratio of an apparent viscosity $\eta 1$ at a rotation number of 1 min$^{-1}$ and $\eta 10$ at a rotation number of 10 min$^{-1}$, $\eta 1/\eta 10$.

If the viscosity of the resin paste is less than 1 Pa·s, it is easily flown when the resin layer is formed, so that a pattern with high precision and high density can be hardly obtained. Also, if it exceeds 1000 Pa·s, the viscosity is too high and formation of the insulating layer likely fails.

A formation method of the resin layer is not specifically limited and can be formed by any methods. For example, there may be mentioned a method of forming a resin layer on the surface of a semiconductor substrate by spin coating, a method of forming resin layers by laminating a resin formed to a film state on the surface of a semiconductor substrate, etc., and particularly preferably, a method of forming a resin layer by subjecting the resin paste to screen printing or metal printing on the surface of a semiconductor substrate, a method of forming a resin layer by subjecting the resin paste to dispense on the surface of a semiconductor substrate, since loss of a material or a number of steps can be reduced.

The resin layer 1 can be also formed by printing a resin using a metal mask. At this time, to thicken the resin layer 1, printing may be repeated with a plural number of times. A thickness of the resin layer 1 is not particularly limited, and it is preferably thick in the point of stress relaxation. The thickness is not particularly limited and preferably 50 to 100 μm. If it is less than 50 μm, a stress absorbing effect becomes poor. On the other hand, if it exceeds 100 μm, a stress absorbing effect is further preferably improved but a thickness of the semiconductor device becomes thick so that the device cannot be made thin. A position of printing the resin layer 1 is preferably covering at least an electronic circuit on the semiconductor wafer 3 completely and removing at least a dicing area 8.

Figure 1C:
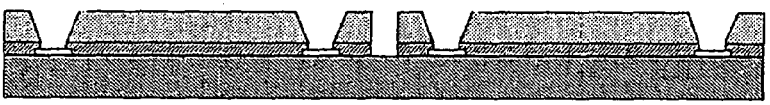

FIG. 1(c) is a drawing in which holes are formed at desired position of the resin layer 1. As a method of forming holes to the resin layer 1, it is carried out by laser to make the state that an electrode pad 5 is exposed.

Figure 1D:
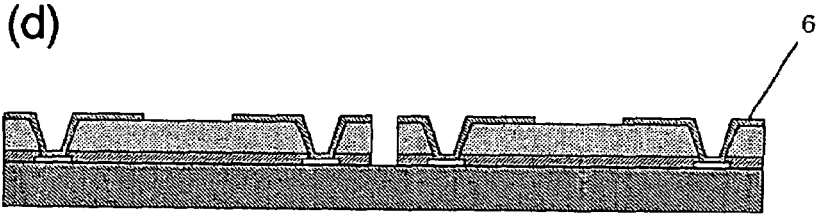

FIG. 1(d) is a drawing in which a second wiring layer 6 is formed on the upper surface of the resin layer 1. A forming method of the second wiring layer 6 is not particularly limited. It is carried out, for example, by forming a sputter metal layer such as Cr, etc., is formed by using a sputter apparatus on the upper surface of the resin layer 1, coating a plate resist on the sputter metal film, subjecting to exposing and developing treatments to the portion at which a Cu plate wiring is to be formed, and after reaching the Cu wiring to the desired thickness, removing the plate resist, and further removing the portion at which the sputter metal film is exposed.

Or else, when the printing portion of the resin layer 1 is made the range in which it completely covers at least an electronic circuit and removes at least the electrode pad 5, the second wiring layer 6 can be formed without forming holes by laser, etc. Since at the edge portion of the resin layer 1 formed by printing, the resin has fluidity so that it does not completely regenerate the shape of the opening portion of the metal mask completely and it becomes a sagged state. When a wiring is formed at this portion, a second wiring layer 6 which electrically connects the electrode pad 5 and an outer electrode terminal 7 can be formed without forming holes by laser. For example, the resin layer 1 is printed at the range which completely covers an electronic circuit but not covers at least the electrode pad 5, a sputter metal film such as Cr, etc., is formed on the upper surface of the resin layer 1 by using a sputter apparatus, a plate resist is coated on the upper surface of the resin layer 1, a Cu wiring is formed by exposure and developing treatments at the portion at which a Cu plating wiring is desired to be formed, a Cu wiring is formed by an electroplating at the portion at which the sputter metal film is exposed, and after the Cu wiring reaches to a desired thickness, the plate resist is removed and further the portion at which the sputter metal film is exposed is removed.

Figure 1E:
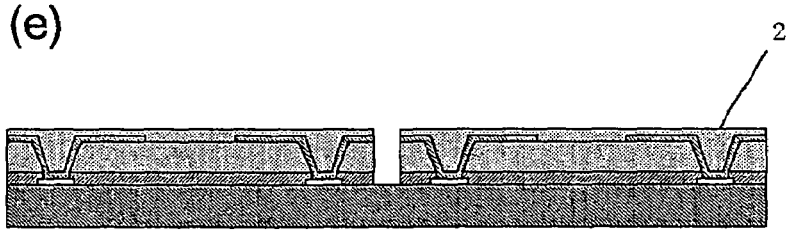

FIG. 1(e) is a drawing in which a protective layer 2 of the second wiring layer is formed. The position of printing the protective layer 2 of the second wiring layer is preferably within the range at which it covers at least the second wiring layer 6 completely but does not cover at least the dicing area 8. A thickness of the protective layer 2 of the second wiring layer is not particularly limited, and preferably, for example, 10 to 50 μm. Also, the resin which forms the protective layer 2 of the second wiring layer preferably comprises the same composition as the resin composition for forming the resin layer 1, and the composition ratio is more preferably the same. For example, the protective layer 2 of the second wiring layer and the resin layer 1 comprises the same composition, but a value of the modulus of elasticity may be changed by changing an amount of the filler. When the same compositions are used in the protective layer 2 of the second wiring layer and the resin layer 1, compatibility of these layers are good and adhesiveness is also excellent.

Figure 1F:
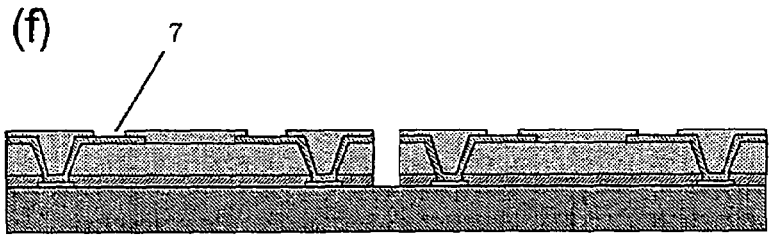

FIG. 1(f) is a drawing in which an outer connecting terminal 7 is formed by opening holes at the desired position(s) of the protective layer 2 of the second wiring layer. A method of forming holes of the protective layer 2 of the second wiring layer, it is carried out by laser to make the state that the second wiring layer 6 is exposed.

Figure 1G:
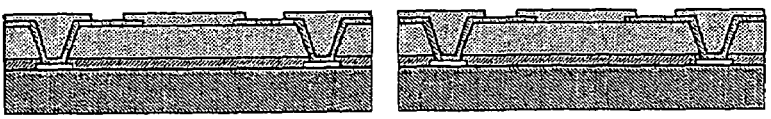

FIG. 1(g) is a drawing in which respective semiconductor devices are formed by cutting the semiconductor wafer 3 is cut at the dicing area 8. Mounting of solder balls to the outer connecting terminals may be carried out either before or after dicing the semiconductor wafer.

EXAMPLES

In the following, the present invention is specifically explained in detail by referring to Examples and Comparative examples, but the scope of the present invention is not limited by these.

Example 1

In a one-liter four-necked flask equipped with a thermometer, a stirrer, a nitrogen inlet tube, and a condenser equipped with an oil-water separator was charged 98.4 g (240 mmol) of 2,2-bis[4-(4-aminophenoxy)phenyl]propane (BAPP) under nitrogen atmosphere, and 700 g of N-methyl-2-pyrrolidone (NMP) was added thereto to dissolve the mixture. Next, while cooling the mixture not to exceed 20° C., 51.2 g (244 mmol) of trimellitic anhydride chloride (TAC) was added to the mixture. After stirring the mixture at room temperature for one hour, 30.3 g (300 mmol) of triethylamine was added while cooling the mixture not to exceed 20° C., and the resulting mixture was reacted at room temperature for 3 hours to produce a polyamic acid varnish. The resulting polyamic acid varnish was further subjected to dehydration reaction at 190° C. for 6 hours to produce a varnish of a polyether amide imide. This varnish of the polyether amide imide was poured into water and the resulting precipitates were separated, crushed and dried to obtain a polyether amide imide powder which is soluble in a polar solvent at room temperature.

In a one-liter four-necked flask equipped with a thermometer, a stirrer, a nitrogen inlet tube, and a condenser equipped with an oil-water separator was charged 98.4 g (240 mmol) of 2,2-bis[4-(4-aminophenoxy)phenyl]propane (BAPP) under nitrogen atmosphere, and 700 g of N-methyl-2-pyrrolidone (NMP) was added thereto to dissolve the mixture. Next, while cooling the mixture not to exceed 20° C., 24.8 g (122 mmol) of isophthalic acid dichloride (IPC) and 39.4 g (122 mmol) of 3,4,3',4'-benzophenonetetracarboxylic acid dianhydride were added to the mixture. After stirring the mixture at room temperature for one hour, 30.3 g (300 mmol) of triethylamine was added while cooling the mixture not to exceed 20° C., and the resulting mixture was reacted at room temperature for 3 hours to produce a polyamic acid varnish. The resulting polyamic acid varnish was further subjected to dehydration reaction at 190° C. for 6 hours to produce a varnish of a polyether amide imide. This varnish of the polyether amide imide was poured into water and the resulting precipitates were separated, crushed and dried to obtain a polyether amide imide powder which is insoluble in a polar solvent at room temperature but soluble by heating.

In a 300 ml four-necked flask equipped with a thermometer, a stirrer, a nitrogen inlet tube, and a condenser equipped with an oil-water separator were charged 15 g of the polyether amide imide powder which is soluble in a polar solvent at room temperature obtained above, 15 g of the polyether amide imide powder which is insoluble in a polar solvent at room temperature but soluble by heating obtained above and 70 g of γ-butyrolactone, and the mixture was stirred. Next, the mixture was stirred at 150° C. for one hour. At this time, the varnish which had been ununiform at room temperature became uniform after heating. After stopping heating, the mixture was cooled by allowing to stand to the room temperature while stirring to obtain a yellow-brownish paste containing two kinds of the resins. A viscosity and a thixotropy coefficient (TI value) of the resulting paste were measured by using a CVO rheometer, etc. which is manufactured by Jusco International Co.

The resulting paste was used for printing by using a screen printer (New Long Seimitsu Kogyo K.K., Japan, LS-34GX attached with an alignment device), a meshless metal plate made of nickel alloy additive plating (manufactured by Mesh Kogyo Co., Japan, thickness: 50 μm, a pattern size: 8 mm×8 mm) and Permalex Metal Squeeze (imported by Tomoe Kogyosha, Co., Japan), and the printing property was measured. After printing, a pattern was observed by an optical microscope, and presence or absence of blurring and sag was observed.

The resulting paste was coated on a Teflon substrate, and heated to 250° C. to evaporate the organic solvent whereby a coated film having a thickness of 25 μm was formed. This film was attached to a dynamic viscoelastic spectrometer (manufactured by K.K. Iwamoto Seisakusho, Japan) and a tensile modulus of elasticity (25° C., 10 Hz), modulus of elasticities at −65° C. and 150° C. (frequency: 10 Hz, temperature raising rate: 2° C./min) and a glass transition temperature (frequency: 10 Hz, temperature raising rate: 2° C./min) thereof were measured. Also, by using a thermobalance, a heat decomposition starting temperature was measured.

The resulting paste was coated on a semiconductor substrate on which a wiring had been formed by screen printing to form a plural number of resin layers, and then, a step of drying, a step of forming a re-wiring on the resin layer, which is electrically connected to an electrode on the semiconductor substrate, a step of forming a protective layer on the re-wiring, and a step of forming an outer electrode terminal to the protective layer, and subjecting to dicing to obtain a semiconductor device. This semiconductor device was subjected to a heat cycle test (−55° C./30 min<-->125° C./30 min, 1000 cycles), and it was examined whether crack is formed at the resin layer or not. The semiconductor device is evaluated where no crack was occurred as O, and crack was occurred as X. The evaluation results of the above-mentioned resin composition and semiconductor device are shown in Table 1.

Example 2

Production of the resin composition and the semiconductor device, and the evaluations thereof were conducted in the same manner as in Example 1 except that, in a synthesis of a polyether amide imide which is soluble in a polar solvent at the room temperature, a diamine compound was changed to 93.3 g (216 mmol) of bis[4-(4-aminophenoxy)phenyl]phenyl]sulfone (BAPS) and 6.0 g (24 mmol) of 1,3-bis(aminopropyl)tetramethyldisiloxane. The results are shown in Table 1.

Example 3

Production of the resin composition and the semiconductor device, and the evaluations thereof were conducted in the same manner as in Example 1 except that, in a synthesis of a polyether amide imide which is soluble in a polar solvent at the room temperature, a diamine compound was changed to 78.7 g (192 mmol) of 2,2-bis[4-(4-aminophenoxy)phenyl]propane (BAPP), 6.0 g (24 mmol) of 1,3-bis(aminopropyl)tetramethyldisiloxane and 4.8 g (24 mmol) of 4,4'-diaminodiphenyl ether, an acid compound was changed to 24.8 g (122 mmol) of isophthalic acid dichloride and 25.6 g (122 mmol) of trimellitic anhydride chloride. The results are shown in Table 1.

Example 4

Production of the resin composition and the semiconductor device, and the evaluations thereof were conducted in the same manner as in Example 1 except that, in a synthesis of a polyether amide imide which is insoluble in a polar solvent at the room temperature but soluble by heating, a diamine compound was changed to 93.3 g (216 mmol) of bis[4-(4-aminophenoxy)phenyl]-sulfone (BAPS) and 6.0 g (24 mmol) of 1,3-bis(aminopropyl)tetramethyldisiloxane. The results are shown in Table 1.

Example 5

Production of the resin composition and the semiconductor device, and the evaluations thereof were conducted in the same manner as in Example 1 except that, in a synthesis of a polyether amide imide which is insoluble in a polar solvent at the room temperature but soluble by heating, a diamine compound was changed to 78.7 g (192 mmol) of 2,2-bis[4-(4-aminophenoxy)phenyl]propane (BAPP), 6.0 g (24 mmol) of 1,3-bis(aminopropyl)tetramethyldisiloxane and 4.8 g (24 mmol) of 4,4'-diaminodiphenyl ether, an acid compound was changed to 12.4 g (61 mmol) of isophthalic acid dichloride, 12.8 g (61 mmol) of trimellitic anhydride chloride and 39.4 g (122 mmol) of 3,4,3',4'-benzophenonetetracarboxilic acid dianhydride. The results are shown in Table 1.

Example 6

To 100 g of the yellow-brownish paste obtained in Example 1, containing 2 kinds of resins, that is, polyether amide imide that is soluble in a polar solvent and polyether amide imide that is insoluble in a polar solvent but soluble by heating, were added 10 g of silicone rubber filler E-601 (Dow Corning Toray Silicone Co., Ltd.), having an average particle size of 2 μm, and the surface thereof being modified with epoxy groups. The mixture was mixed and kneaded and dispersed with three-roll mills to obtain a yellow-brownish paste.

As an evaluation of dispersibility of this paste, it was analyzed with respect to presence or absence of precipitates after being left for one week, and presence or absence of coagulation during a preparation of a coating film.

Using this paste, the evaluations of the resin composition, as well as production and evaluations of the semiconductor device were conducted in the same manner as in Example 1. The results are shown in Table 1.

Example 7

Production of the resin composition and the semiconductor device and the evaluations thereof were conducted in the same manner as in Example 6, except that an amount of the silicone rubber filler having an average particle size of 2 μm and the surface thereof being modified with epoxy groups, was changed to 15 g. The results are shown in Table 1.

Example 8

Production of the resin composition and the semiconductor device and the evaluations thereof were conducted in the same manner as in Example 6, except that an amount of the silicone rubber filler having an average particle size of 2 μm and the surface thereof being modified with epoxy groups, was changed to 20 g. The results are shown in Table 1.

Example 9

Production of the resin composition and the semiconductor device and the evaluations thereof were conducted in the same manner as in Example 6, except that an amount of the silicone rubber filler having an average particle size of 2 μm and the surface thereof being modified with epoxy groups, was changed to 25 g. The results are shown in Table 1.

Example 10

Production of the resin composition and the semiconductor device and the evaluations thereof were conducted in the same manner as in Example 6, except that an amount of the silicone rubber filler having an average particle size of 2 μm and the surface thereof being modified with epoxy groups, was changed to 30 g. The results are shown in Table 1.

TABLE 1

| Item | | | Example 1 | 2 | 3 | 4 | 5 | 6 | 7 | 8 | 9 | 10 |
|---|---|---|---|---|---|---|---|---|---|---|---|---|
| Resin soluble in polar solvent at room temperature | Diamine | Formula (I) | ○ | ○ | ○ | ○ | ○ | ○ | ○ | ○ | ○ | ○ |
| | | Aromatic diamine other than formula (I) | — | — | ○ | — | — | — | — | — | — | — |
| | | Aliphatic diamine | — | ○ | ○ | — | — | — | — | — | — | — |
| | Acid | Dicarboxylic acid | — | — | ○ | — | — | — | — | — | — | — |
| | | Tricarboxylic acid | ○ | ○ | ○ | ○ | ○ | ○ | ○ | ○ | ○ | ○ |
| Resin insoluble in polar solvent at room temperature but soluble by heating | Diamine | Formula (I) | ○ | ○ | ○ | ○ | ○ | ○ | ○ | ○ | ○ | ○ |
| | | Aromatic diamine other than formula (I) | — | — | — | — | ○ | — | — | — | — | — |
| | | Aliphatic diamine | — | — | — | ○ | ○ | — | — | — | — | — |
| | Acid | Dicarboxylic acid | ○ | ○ | ○ | ○ | ○ | ○ | ○ | ○ | ○ | ○ |
| | | Tricarboxylic acid | — | — | — | — | ○ | — | — | — | — | — |
| | | Tetracarboxylic acid | ○ | ○ | ○ | ○ | ○ | ○ | ○ | ○ | ○ | ○ |
| Amount of resin | | | 100 | 100 | 100 | 100 | 100 | 30 | 30 | 30 | 30 | 30 |
| Amount of low elasticity filler | | | — | — | — | — | — | 10 | 15 | 20 | 25 | 30 |

TABLE 1-continued

| Item | | Example | | | | | | | | | |
|---|---|---|---|---|---|---|---|---|---|---|---|
| | | 1 | 2 | 3 | 4 | 5 | 6 | 7 | 8 | 9 | 10 |
| Chemical modification of filler surface | | — | — | — | — | — | Done | Done | Done | Done | Done |
| Average particle size of filler [μm] | | — | — | — | — | — | 2.0 | 2.0 | 2.0 | 2.0 | 2.0 |
| Dispersibility | Precipitation | — | — | — | — | — | None | None | None | None | None |
| | Aggregated material | — | — | — | — | — | None | None | None | None | None |
| Viscosity [Pa · s] | | 580 | 540 | 560 | 560 | 520 | 540 | 580 | 550 | 530 | 560 |
| TI value | | 4.5 | 4.0 | 4.5 | 3.4 | 3.8 | 3.6 | 4.0 | 3.8 | 4.2 | 4.0 |
| Printing property (presence of blur · sag) | | None | None | None | None | None | None | None | None | None | None |
| Modulus of | 25° C. | 2.8 | 2.8 | 2.8 | 2.8 | 2.8 | 2.5 | 2.0 | 1.5 | 1.0 | 0.5 |
| elasticity | −65° C. | 3.2 | 3.2 | 3.2 | 3.2 | 3.2 | 2.9 | 2.4 | 1.8 | 1.2 | 0.6 |
| [GPa] | 150° C. | 2.5 | 2.5 | 2.5 | 2.5 | 2.5 | 2.2 | 1.8 | 1.2 | 0.8 | 0.3 |
| Elasticity changed ratio at 150° C./−65° C. [%] | | 78 | 78 | 78 | 78 | 78 | 76 | 75 | 67 | 67 | 50 |
| Glass transition temperature (Tg) [° C.] | | 240 | 230 | 230 | 230 | 240 | 220 | 215 | 210 | 205 | 200 |
| Thermal decomposition initiating temperature [° C.] | | 440 | 430 | 435 | 440 | 430 | 420 | 415 | 410 | 405 | 400 |
| Evaluation of semiconductor device | | ◯ | ◯ | ◯ | ◯ | ◯ | ◯ | ◯ | ◯ | ◯ | ◯ |

Example 11

In a one-liter four-necked flask equipped with a thermometer, a stirrer, a nitrogen inlet tube, and a condenser equipped with an oil-water separator was charged 98.4 g (240 mmol) of 2,2-bis[4-(4-aminophenoxy)phenyl]propane (BAPP) as a diamine compound, under nitrogen atmosphere, and 700 g of N-methyl-2-pyrrolidone (NMP) was added to dissolve the mixture. Next, while cooling the mixture not to exceed 20° C., 80.6 g (260 mmol) of bis(3,4-dicarboxyphenyl)ether dianhydride was added to the mixture. After being stirred at room temperature for one hour, the mixture was further subjected to dehydration reaction at 190° C. for 6 hours to produce a varnish of a polyether amide imide. This varnish of the polyether amide imide was poured into water and the resulting precipitates were separated, crushed and dried to obtain a polyether imide powder which is insoluble in a polar solvent at room temperature but soluble by heating.

Production of the resin composition and the semiconductor device and the evaluations thereof were conducted in the same manner as in Example 1, except that polyether imide powder obtained above was used in place of polyether amide imide powder that is insoluble in a polar solvent but soluble by heating. The results are shown in Table 2.

Example 12

Production of the resin composition and the semiconductor device and the evaluations thereof were conducted in the same manner as in Example 1, except that in a synthesis of polyether amide imide used in Example 1, which is soluble in an polar solvent at the room temperature, a diamine compound was changed to 93.3 g (216 mmol) of 2,2-bis[4-(4-aminophenoxy)phenyl]sulfone (BAPS) and 6.0 g (24 mmol) of 1,3-bis(aminopropyl)tetramethyldisiloxane, and polyether imide powder obtained in Example 11 was used in place of polyether amide imide powder that is insoluble in a polar solvent at the room temperature but soluble by heating. The results are shown in Table 2.

Example 13

Production of the resin composition and the semiconductor device and the evaluations thereof were conducted in the same manner as in Example 1, except that in a synthesis of polyether amide imide in Example 1, which is soluble in a polar solvent at the room temperature, a diamine compound was changed to 78.7 g (192 mmol) of 2,2-bis[4-(4-aminophenoxy)phenyl]propane (BAPP), 6.0 g (24 mmol) of 1,3-bis(aminopropyl)tetramethyldisiloxane and 4.8 g (24 mmol) of 4,4'-diaminodiphenyl ether, an acid compound was changed to 24.8 g (122 mmol) of isophthalic acid dichloride and 25.6 g (122 mmol) of trimellitic anhydride chloride and polyether imide powder obtained in Example 11 was used in place of polyether amide imide powder that is insoluble in a polar solvent at the room temperature but soluble by heating. The results are shown in Table 2.

Example 14

Production of the resin composition and the semiconductor device and the evaluations thereof were conducted in the same manner as in Example 1, except that in a synthesis of polyether imide employed in Example 11, which is insoluble in an polar solvent at the room temperature but soluble by heating, a diamine compound was changed to 93.3 g (216 mmol) of bis[4-(4-aminophinoxy)phenyl]sulfone (BAPS) and 6.0 g (24 mmol) of 1,3-bis(aminopropyl)tetramethyldisiloxane. The results are shown in Table 2.

Example 15

Production of the resin composition and the semiconductor device, and the evaluations thereof were conducted in the same manner as in Example 1 except that, in a synthesis of a polyether imide employed in Example 11, which is in soluble in a polar solvent at the room temperature but soluble by heating, a diamine compound was changed to 78.7 g (192 mmol) of 2,2-bis[4-(4-aminophenoxy)phenyl]propane (BAPP), 6.0 g (24 mmol) of 1,3-bis(aminopropyl)tetramethyldisiloxane and 4.8 g (24 mmol) of 4,4'-diaminodiphenyl ether. The results are shown in Table 2.

Example 16

Production of the resin composition and the semiconductor device and the evaluations thereof were conducted in the same manner as in Example 6, except that polyether imide obtained in Example 11 was used in place of polyether amide imide used in Example 6, which is insoluble in a polar solvent at the room temperature but soluble by heating. The results are shown in Table 2.

Example 17

Production of the resin composition and the semiconductor device and the evaluations thereof were conducted in the same manner as in Example 6, except that polyether imide obtained in Example 11 was used in place of polyether amide imide used in Example 6, which is insoluble in a polar solvent at the room temperature but soluble by heating, and an amount of the silicone rubber filler having an average particle size of 2 μm and the surface thereof being modified with epoxy groups, was changed to 15 g. The results are shown in Table 2.

Example 18

Production of the resin composition and the semiconductor device and the evaluations thereof were conducted in the same manner as in Example 6, except that polyether imide obtained in Example 11 was used in place of polyether amide imide used in Example 6, which is insoluble in a polar solvent at the room temperature but soluble by heating, and an amount of the silicone rubber filler having an average particle size of 2 μm and the surface thereof being modified with epoxy groups, was changed to 20 g. The results are shown in Table 2.

Example 19

Production of the resin composition and the semiconductor device and the evaluations thereof were conducted in the same manner as in Example 6, except that polyether imide obtained in Example 11 was used in place of polyether amide imide used in Example 6, which is insoluble in a polar solvent at the room temperature but soluble by heating, and an amount of the silicone rubber filler having an average particle size of 2 μm and the surface thereof being modified with epoxy groups, was changed to 25 g. The results are shown in Table 2.

Example 20

Production of the resin composition and the semiconductor device and the evaluations thereof were conducted in the same manner as in Example 6, except that polyether imide obtained in Example 11 was used in place of polyether amide imide used in Example 6, which is insoluble in a polar solvent at the room temperature but soluble by heating, and an amount of the silicone rubber filler having an average particle size of 2 μm and the surface thereof being modified with epoxy groups, was changed to 30 g. The results are shown in Table 2.

Comparative Example 1

Production of the resin composition and the semiconductor device and the evaluations thereof were conducted in the same manner as in Example 1, except that a resin composition consisting only of polyether amide imide that is soluble in a polar solvent at the room temperature was used in place of polyether amide imide that is insoluble in a polar solvent at the room temperature but soluble by heating. As a result, TI value of the resin composition was 1.0, and in the valuation of printing property, blurring and sag were observed.

In addition, it was impossible to produce a semiconductor device using this composition. The results are shown in Table 2.

TABLE 2

| Item | | | Example 11 | 12 | 13 | 14 | 15 | 16 | 17 | 18 | 19 | 20 | Comparative example 1 |
|---|---|---|---|---|---|---|---|---|---|---|---|---|---|
| Resin soluble in polar solvent at room temperature | Diamine | Formula (I) | ○ | ○ | ○ | ○ | ○ | ○ | ○ | ○ | ○ | ○ | ○ |
| | | Aromatic diamine other than formula (I) | — | — | ○ | — | — | — | — | — | — | — | — |
| | | Aliphatic diamine | — | ○ | ○ | — | — | — | — | — | — | — | — |
| | Acid | Dicarboxylic acid | — | — | ○ | — | — | — | — | — | — | — | — |
| | | Tricarboxylic acid | ○ | ○ | ○ | ○ | ○ | ○ | ○ | ○ | ○ | ○ | ○ |
| Resin insoluble in polar solvent at room temperature but soluble by heating | Diamine | Formula (I) | ○ | ○ | ○ | ○ | ○ | ○ | ○ | ○ | ○ | ○ | — |
| | | Aromatic diamine other than formula (I) | — | — | — | — | ○ | — | — | — | — | — | — |
| | | Aliphatic diamine | — | — | — | ○ | ○ | — | — | — | — | — | — |
| | Acid | Tetracarboxylic acid | ○ | ○ | ○ | ○ | ○ | ○ | ○ | ○ | ○ | ○ | — |
| Amount of resin | | | 100 | 100 | 100 | 100 | 100 | 30 | 30 | 30 | 30 | 30 | 100 |
| Amount of low elasticity filler | | | — | — | — | — | — | 10 | 15 | 20 | 25 | 30 | — |
| Chemical modification of filler surface | | | — | — | — | — | — | Done | Done | Done | Done | Done | — |
| Average particle size of filler [μm] | | | — | — | — | — | — | 2.0 | 2.0 | 2.0 | 2.0 | 2.0 | — |
| Dispersibility | Precipitation | | — | — | — | — | — | None | None | None | None | None | — |
| | Aggregated material | | — | — | — | — | — | None | None | None | None | None | — |
| Viscosity [Pa·s] | | | 570 | 540 | 550 | 570 | 530 | 550 | 570 | 560 | 530 | 570 | 550 |
| TI value | | | 4.3 | 4.1 | 4.4 | 3.5 | 3.9 | 3.8 | 4.2 | 3.9 | 4.1 | 4.2 | 1.0 |
| Printing property (presence of blur · sag) | | | None | None | None | None | None | None | None | None | None | None | Present |
| Modulus of elasticity [GPa] | 25° C. | | 2.9 | 2.9 | 2.9 | 2.9 | 2.9 | 2.5 | 2.0 | 1.5 | 1.0 | 2.8 | 2.8 |
| | −65° C. | | 3.2 | 3.2 | 3.2 | 3.2 | 3.2 | 2.9 | 2.4 | 1.8 | 1.2 | 3.2 | 3.2 |
| | 150° C. | | 2.5 | 2.5 | 2.5 | 2.5 | 2.5 | 2.2 | 1.8 | 1.2 | 0.8 | 2.5 | 2.5 |
| Elasticity changed ratio at 150° C./−65° C. [%] | | | 78 | 78 | 78 | 78 | 78 | 76 | 75 | 67 | 67 | 50 | 78 |
| Glass transition temperature (Tg) [° C.] | | | 240 | 230 | 235 | 230 | 240 | 225 | 215 | 210 | 205 | 200 | 240 |
| Thermal decomposition initiating temperature [° C.] | | | 450 | 440 | 440 | 430 | 440 | 420 | 415 | 410 | 405 | 400 | 440 |
| Evaluation of semiconductor device | | | ○ | ○ | ○ | ○ | ○ | ○ | ○ | ○ | ○ | ○ | Impossible to prepare |

Synthesis Example 1

Heat-Resistant Resin A"-1

In a one-liter four-necked flask equipped with a thermometer, a stirrer, a nitrogen inlet tube, and a condenser equipped with an oil-water separator were charged 96.7 g (0.3 mol) of 3,4,3'4'-benzophenonetetracarboxylic acid dianhydride (hereinafter referred to as BTDA), 36.0 g (0.18 mol) of 4,4'-diaminodiphenyl ether (hereinafter referred to as DDE), 43.1 g (0.105mol) of 2,2-bis[4-(4-aminophenoxy)phenyl]propane (hereinafter referred to as BAPP), 3.73 g (0.015 mol) of 1,3-bis(3-aminopropyl)tetramethyldisiloxane, and 381.5 g of γ-butyrolactone under nitrogen atmosphere.

The resultant mixture was subjected to a reaction at a temperature of 60 to 65° C. for 2 hours under stirring. The reaction was terminated by cooling the mixture at a point where a number average molecular weight reached 50,000 (polystyrene converted value). The thus obtained solution was diluted by γ-butyrolactone to obtain a polyimide precursor (heat-resistant resin A"-1) solution having a resin concentration of 30% by weight.

Synthesis Example 2

Heat-Resistant Resin B"-1

In a one-liter four-necked flask equipped with a thermometer, a stirrer, a nitrogen inlet tube, and a condenser equipped with an oil-water separator were charged 109.6 g (0.4 mol) of BTDA, 76.1 g (0.38 mol) of DDE, 4.97 g (0.02 mol) of 1,3-bis(3-aminopropyl)tetramethyldisiloxane, and 405.2 g of γ-butyrolactone under nitrogen atmosphere.

The resultant mixture was subjected to a reaction at a temperature of from 60° C. to 65° C. for 2 hours under stirring. The reaction was terminated by cooling the mixture at a point where a number average molecular weight reached 35,000 (polystyrene converted value). The thus obtained solution was diluted by γ-butyrolactone to obtain a polyimide precursor solution (heat-resistant resin B"-1) having a resin concentration of 30% by weight.

Preparation Example 1

Heat-Resistant Resin Based Paste: Heat Resistant Resin A"-1/Heat-Resistant Resin B"-1)

In a one-liter four-necked flask equipped with a thermometer, a stirrer, a nitrogen inlet tube, and a condenser equipped with an oil-water separator were charged 150 g of the above described heat-resistant resin B-1 polyimide precursor solution (resin concentration of 30% by weight) and 350 g of the above described heat-resistant resin A-1 polyimide precursor solution (resin concentration of 30% by weight), under nitrogen atmosphere. The resultant mixture was subjected to stirring at a temperature of 60 to 65° C. for one hour to obtain a uniform transparent solution. The mixture was further subjected to stirring at a temperature of 60 to 65° C. for 24 hours, whereby heat-resistant resin B"-1 polyimide precursor particles are precipitated and dispersed in the solution. This was diluted by γ-butyrolactone to obtain a polyimide type heat-resistant resin past (1) having a viscosity of 480 Pa·s and thixotropic coefficient (hereinafter referred as to TI value) of 3.0. The heat-resistant resin B"-1 polyimide precursor particles in the polyimide type heat-resistant resin paste (1) were insoluble in γ-butyrolactone at the room temperature but soluble at 80° C.

The above described polyimide type heat-resistant resin paste (1) was coated on a glass substrate (thickness; about 2 mm), by a bar coater coating whereby a coated film having a thickness of 50 μm after heat drying was formed. It was subjected to heat-treating at 80° C. for 5 minutes, 100° C. for 10 minutes, 150° C. for 10 minutes, 200° C. for 15 minutes, and further, 300° C. for 60 minutes, to obtain a glass substrate coated with polyimide type resin composition (1). The coated film was almost uniform and transparent, and the heat-resistant resin B"-1 polyimide precursor particles in the polyimide type heat-resistant resin paste (1) were dissolved in γ-butyrolactone while a heating process, they were further dehydrated and cyclized together with a heat-resistant resin A"-1 polyimide precursor, being dissolved in a state of polyimide resin in the solution.

Synthesis Example 3

Heat-Resistant Resin A"-2

In a one-liter four-necked flask equipped with a thermometer, a stirrer, a nitrogen inlet tube, and a condenser equipped with an oil-water separator were charged 77.3 g (0.24 mol) of BTDA, 31.4 g (0.06 mol) of 1,10-(decamethylene)bis(trimellitate dianhydride), 36.0 g (0.18 mol) of DDE, 43.1 g (0.105 mol) of BAPP, 3.73 g (0.015 mol) of 1,3-bis(3-aminopropyl)tetramethyldisiloxane, and 381.5 g of γ-butyrolactone under nitrogen atmosphere.

The resultant mixture was subjected to a reaction at a temperature of 60 to 65° C. for 2 hours under stirring. The reaction was terminated by cooling the mixture at a point where a number average molecular weight reached 60,000 (polystyrene converted value). The thus obtained solution was diluted by γ-butyrolactone to obtain a polyimide precursor solution (heat-resistant resin A"-2) having a resin concentration of 30% by weight.

Preparation Example 2

Heat-Resistant Resin Based Paste: Heat Resistant Resin A"-2/Heat-Resistant Resin B"-1

In a one-liter four-necked flask equipped with a thermometer, a stirrer, a nitrogen inlet tube, and a condenser equipped with an oil-water separator were charged 100 g of the above described heat-resistant resin B"-1 polyimide precursor solution (resin concentration of 30% by weight) and 400 g of the above described heat-resistant resin A"-2 polyimide precursor solution (resin concentration of 30% by weight), under nitrogen atmosphere. The resultant mixture was subjected to stirring at a temperature of 60 to 65° C. for one hour to obtain a uniform transparent solution. The mixture was further subjected to stirring at a temperature of 60 to 65° C. for 34 hours, whereby heat-resistant resin B"-1 polyimide precursor particles are precipitated and dispersed in the solution. This was diluted by γ-butyrolactone to obtain a polyimide type heat-resistant resin past (2) having a viscosity of 450 Pa·s and thixotropic coefficient (hereinafter referred as to TI value) of 5.5. The heat-resistant resin B"-1 polyimide precursor particles in the polyimide type heat-resistant resin paste (2) were insoluble in γ-butyrolactone at the room temperature but soluble at 80° C.

The above described polyimide type heat-resistant resin paste (2) was coated on a glass substrate (thickness; about 2 mm), by a bar coater coating whereby a coated film having a thickness of 50 μm after heat drying was formed. It was subjected to heat-treating at 80° C. for 5 minutes, 100° C. for 10 minutes, 150° C. for 10 minutes, 200° C. for 15 minutes, and further, 250° C. for 60 minutes, to obtain a glass substrate coated with polyimide type resin composition (2). The coated film was almost uniform and transparent, and the heat-resistant resin B"-1 polyimide precursor particles in the polyimide type heat-resistant resin paste were dissolved in γ-butyrolactone while a heating process, they were further dehydrated and cyclized together with a heat-resistant resin A"-2 polyimide precursor, being dissolved in a state of a polyimide resin in the solution.

Synthesis Example 4

Heat-Resistant Resin A"-3

In a one-liter four-necked flask equipped with a thermometer, a stirrer, a nitrogen inlet tube, and a condenser equipped with an oil-water separator were charged 32.2 g (0.1 mol) of BTDA, 52.2 g (0.1 mol) of 1,10-(decamethylene)bis(trimellitate dianhydride), 36.0 g (0.18 mol) of DDE, 43.1 g (0.105 mol) of BAPP, 3.73 g (0.015 mol) of 1,3-bis(3-aminopropyl)tetramethyldisiloxane, and 381.5 g of γ-butyrolactone under nitrogen atmosphere.

The resultant mixture was subjected to a reaction at a temperature of 60 to 65° C. for 2 hours under stirring. The reaction was terminated by cooling the mixture at a point where a number average molecular weight reached 45,000 (polystyrene converted value). The thus obtained solution was diluted by γ-butyrolactone to obtain a polyimide precursor solution (heat-resistant resin A"-3) having a resin concentration of 30% by weight.

Preparation Example 3

Heat-Resistant Resin Based Paste: Heat Resistant Resin A"-3/Heat-Resistant Resin B"-1

In a one-liter four-necked flask equipped with a thermometer, a stirrer, a nitrogen inlet tube, and a condenser equipped with an oil-water separator were charged 250 g of the above described heat-resistant resin B-1 polyimide precursor solution (resin concentration of 30% by weight) and 250 g of the above described heat-resistant resin A-3 polyimide precursor solution (resin concentration of 30% by weight), under nitrogen atmosphere. The resultant mixture was subjected to stirring at a temperature of 60 to 65° C. for one hour to obtain a uniform transparent solution. The mixture was further subjected to stirring at a temperature of 60 to 65° C. for 14 hours, whereby heat-resistant resin B"-1 polyimide precursor particles are precipitated and dispersed in the solution. This was diluted by γ-butyrolactone to obtain a polyimide type heat-resistant resin past (3) having a viscosity of 400 Pa·s and thixotropic coefficient (hereinafter referred as to TI value) of 4.5. The heat-resistant resin B"-1 polyimide precursor particles in the polyimide type heat-resistant resin paste (3) were insoluble in γ-butyrolactone at the room temperature but soluble at 80° C.

The above described polyimide type heat-resistant resin paste (3) was coated on a glass substrate (thickness; about 2 mm), by a bar coater coating whereby a coated film having a thickness of 50μm after heat drying was formed. It was subjected to heat-treating at 80° C. for 5 minutes, 100° C. for 10 minutes, 150° C. for 10 minutes, 200° C. for 15 minutes, and further, 250° C. for 60 minutes, to obtain a glass substrate coated with polyimide type resin composition (3). The coated film was almost uniform and transparent, and the heat-resistant resin B"-1 polyimide precursor particles in the polyimide type heat-resistant resin paste were dissolved in γ-butyrolactone while a heating process, they were further dehydrated and cyclized together with a heat-resistant resin A"-3 polyimide precursor, being dissolved in a state of polyimide resin in the solution.

Synthesis Example 5

Heat-Resistant Resin A"-4

In a one-liter four-necked flask equipped with a thermometer, a stirrer, a nitrogen inlet tube, and a condenser equipped with an oil-water separator were charged 65.69 g (0.16 mol) of BAPP, 143.22 g (0.40 mol) of bis(3,4-dicarboxyphenyl) sulfone dianhydride (hereinafter referred to as DSDA), 38.84 g (0.20 mol) of isophthalic acid dihydrazide, 9.93 g (0.04 mol) of 1,3-bis(3-aminopropyl)tetramethyldisiloxane, and 478 g of γ-butyrolactone under nitrogen atmosphere.

The resultant mixture was subjected to a reaction under stirring at a temperature of 50 to 60° C. for one hour, then the temperature was elevated to 195° C. for the reaction to proceed. The reaction was terminated by cooling the mixture at a point where a number average molecular weight reached 27,000 (polystyrene converted value). During the reaction, distillated water was immediately removed out of the reaction system. The thus obtained solution was diluted by γ-butyrolactone to obtain a polyamide imide resin solution (heat-resistant resin A"-4) having a resin concentration of 30% by weight.

Synthesis Example 6

Heat-Resistant Resin B"-2

In a one-liter four-necked flask equipped with a thermometer, a stirrer, a nitrogen inlet tube, and a condenser equipped with an oil-water separator were charged 102.6 g (0.25 mol) of BAPP, 77.55 g (0.25mol) of bis(3,4-dicarboxyphenyl) ether dianhydride (hereinafter referred to as ODPA), and 335 g of γ-butyrolactone under nitrogen atmosphere.

The resultant mixture was subjected to a reaction under stirring at a temperature of 50 to 60° C. for one hour, then the temperature was elevated to 195° C. for the reaction to proceed. The reaction was terminated by cooling the mixture at a point where a number average molecular weight reached 28,000 (polystyrene converted value). During the reaction, distillated water was immediately removed out of the reaction system. The thus obtained solution was diluted by γ-butyrolactone to obtain a polyimide resin solution (heat-resistant resin B"-2) having a resin concentration of 30% by weight.

Preparation Example 4 (Heat-Resistant Resin Based Paste: Heat Resistant Resin A"-4/Heat-Resistant Resin B"-2)

In a one-liter four-necked flask equipped with a thermometer, a stirrer, a nitrogen inlet tube, and a condenser equipped with an oil-water separator were charged 200 g of the above described heat-resistant resin B"-2 polyimide resin solution (resin concentration of 30% by weight) and 466.67 g of the above described heat-resistant resin A"-4 polyamide imide resin solution (resin concentration of 30% by weight), under nitrogen atmosphere. The resultant mixture was subjected to stirring at a temperature of 180° C. for one hour to obtain a uniform transparent solution. The mixture was cooled down to 23° C. in one hour, then allowed to stand for 1 month, whereby heat resistant polyimide resin particles are precipitated and dispersed in the solution. This was diluted by γ-butyrolactone to obtain a polyimide type heat-resistant resin past (4) having a viscosity of 380 Pa·s and thixotropic coefficient (hereinafter referred as to TI value) of 2.5. The obtained polyimide resin particle had a maximum particle diameter of 5 μm or less, being insoluble in γ-butyrolactone at the room temperature but soluble at 150° C.

The above described polyimide type-heat-resistant resin paste (4) was coated on a glass substrate (thickness; about 2 mm), by a bar coater coating whereby a coated film having a thickness of 50 μm after heat drying was formed. It was subjected to heat-treating at 140° C. for 15 minutes, 200° C. for 15 minutes and further, 300° C. for 60 minutes, to obtain a glass substrate coated with polyimide type resin composition (4). The coated film was almost uniform and transparent, and the polyimide resin particles (heat-resistant resin B"-2) in the polyimide type heat-resistant resin paste (4) were dissolved in γ-butyrolactone while a heating process, they were further observed to be dissolved together with the polyamide imide resin (heat-resistant resin A"-4) in the solution.

Synthesis Example 7

Heat-Resistant Resin A"-5

In a one-liter four-necked flask equipped with a thermometer, a stirrer, a nitrogen inlet tube, and a condenser equipped with an oil-water separator were charged 89.09 g (0.217 mol) of BAPP, 119.59 g (0.334 mol) of DSDA, 42.85 g (0.117 mol) of 2,2-bis(4-hydroxy-3-aminophenyl)hexafluoropropane (here-inafter referred to as HAB-6F), and 377 g of γ-butyrolactone under nitrogen atmosphere.

The resultant mixture was subjected to a reaction under stirring at a temperature of 50 to 60° C. for one hour, then the temperature was elevated to 195° C. for the reaction to proceed. The reaction was terminated by cooling the mixture at a point where a number average molecular weight reached 26,000 (polystyrene converted value). During the reaction, distillated water was immediately removed out of the reaction system. The thus obtained solution was diluted by γ-butyrolactone to obtain a polyimide resin solution (heat-resistant resin A"-5) having a resin concentration of 40% by weight.

Preparation Example 5

Heat-Resistant Resin Based Paste: Heat Resistant Resin A"-5/Heat-Resistant Resin B"-2

In a one-liter four-necked flask equipped with a thermometer, a stirrer, a nitrogen inlet tube, and a condenser equipped with an oil-water separator was charged 400 g of the above described heat-resistant resin B"-2 polyimide resin solution (resin concentration of 30% by weight), under nitrogen atmosphere. The temperature of the resin was elevated to 180° C. The resin was subjected to stirring at the same temperature for one hour, then mixed with 300 g of the above described heat-resistant resin A"-5 polyimide resin solution (resin concentration of 40%). The resultant mixture was subjected to stirring at 180° C. for one hour. The mixture was cooled down to 60° C. in one hour, then stirred for one day, thereby to obtain a paste in which heat resistant polyimide resin particles are precipitated and dispersed. To this paste, 48 g of γ-glycidoxypropyltrimethoxysilane was added, followed by mixing thoroughly at the room temperature. This was diluted by γ-butyrolactone to obtain a polyimide type heat-resistant resin past (5) having a viscosity of 150 Pa·s and TI value of 3.5.

The above described polyimide type heat-resistant resin paste (5) was coated on a glass substrate (thickness; about 2 mm), by a bar coater coating whereby a coated film having a thickness of 50 μm after heat drying was formed. It was subjected to heat-treating at 140° C. for 15 minutes, 200° C. for 15 minutes and further, 300° C. for 60 minutes, to obtain a glass substrate coated with polyimide type resin composition (5). The coated film was almost uniform and transparent, and the polyimide resin particles (heat-resistant resin B"-2) in the polyimide type heat-resistant resin paste (4) were dissolved in γ-butyrolactone while a heating process, they were further observed to be dissolved together with the polyamide imide resin (heat-resistant resin A"-5) in the solution.

Example 21

To 200 parts by weight of the polyimide type heat-resistant resin paste (1) (resin concentration of 30% by weight) obtained in Preparation Example 1 were added 40 parts by weight of fine particles of silicone rubber elastic material (TREFIL E-601 available from Dow Corning Toray Silicone Co., Ltd.) having an average particle size of 2 μm and the surface thereof being introduced with epoxy groups and 70 parts by weight of γ-butyrolactone. The mixture was mixed and kneaded with three-roll mills to prepare a heat-resistant resin paste (6).

After the resulting heat-resistant resin paste (6) was degassed, it was coated on a 5 inch silicon wafer by a bar coater coating whereby a coated film having a thickness of 50 μm after heat drying was formed. It was subjected to heat-treating at 80° C. for 5 minutes, 100° C. for 10 minutes, 150° C. for 10 minutes, 200° C. for 15 minutes, and further, 300° C. for 60 minutes, to obtain a silicon wafer coated with polyimide type resin composition (6). With respect to the obtained polyimide type resin composition (6), elasticities, mechanical strength of the film, and glass transition temperatures were measured Here, a modulus of elasticity was measured by using a viscoelasticity analyzer RSAII manufactured by Rheomethoric Scientific F. E. Co. in air, with a temperature rising rate of 5° C./min and a frequency of 1 Hz. A mechanical strength of the film was measured by using a Tensilon multi tester UCT-5T manufactured by Orientech, Co. The glass transition temperature was measured by using a Thermomechanical analyzer TMA/SS6100 manufactured by Seiko Instruments Co.

Also, by using the heat-resistant resin paste (6), a resin film pattern was prepared by coating on a 8 inch silicon wafer so that a thickness after heating and drying becomes 50 μm, using a screen printer (New Long Seimitsu Kogyo K.K., Japan, LS-34GX attached with an alignment device), a meshless metal plate made of nickel alloy additive plating (manufactured by Mesh Kogyo Co., Japan, thickness: 100 μm, a pattern size: 8 mm×8 mm) and Permalex Metal Squeeze (imported by Tomoe Kogyo Co., Japan), and the printing property thereof was measured. After printing, a pattern was observed by an optical microscope, and presence or absence of pattern losing and scratching were observed.

The heat-resistant resin paste (6) obtained above was coated on a semiconductor substrate on which a wiring had been formed by screen printing to form a plural number of resin layers, and then, a step of drying, a step of forming a re-wiring on the resin layer, which is electrically connected to an electrode on the semiconductor substrate, a step of forming a protective layer on the re-wiring, a step of forming an outer electrode terminal to the protective layer, a step of forming a protective layer excluding a loading part of solder balls, and a step of loading solder balls were conducted, followed by dicing to obtain a semiconductor device. This semiconductor device was subjected to a heat cycle test of −65° C./15 min and 150° C./15 min for 1000 cycles. The semiconductor device is evaluated where no abnormality occurred as good.

The evaluation results of the above-mentioned heat-resistant resin paste (6), the resin film and the semiconductor device obtained therefrom are shown in Table 3.

Example 22

To 233 parts by weight of polyimide type heat-resistant resin paste (2) (resin concentration of 30% by weight) obtained in Preparation example 2 were added 30 parts by weight of fine particles of silicone rubber elastic material (TREFIL E-601 available from Dow Corning Toray Silicone Co., Ltd.) having an average particle size of 2 μm and the surface thereof being introduced with epoxy groups and 50 parts by weight of γ-butyrolactone, a heat-resistant resin paste (7) was prepared by mixing and kneading with three-roll mills, and the material was evaluated in the same manner as in Example 21 except for changing the final temperature of heating to 250° C. The evaluation results of the above-mentioned heat-resistant resin paste (7), the resin film and the semiconductor device obtained therefrom are shown in Table 3.

Example 23

To 266 parts by weight of polyimide type heat-resistant resin paste (3) (resin concentration of 30% by weight) obtained in Preparation example 3 were added 20 parts by weight of fine particles of silicone rubber elastic material (TREFIL E-601 available from Dow Corning Toray Silicone Co., Ltd.) having an average particle size of 2 μm and the surface thereof being introduced with epoxy groups and 26 parts by weight of γ-butyrolactone, a heat-resistant resin paste (8) was prepared by mixing and kneading with three-roll mills, and the material was evaluated in the same manner as in Example 22 except for using the paste. The evaluation results of the above-mentioned heat-resistant resin paste (8), the resin film and the semiconductor device obtained therefrom are shown in Table 3.

Example 24

To 200 parts by weight of polyimide type heat-resistant resin paste (4) (resin concentration of 30% by weight) obtained in Preparation example 4 were added 40 parts by weight of fine particles of silicone rubber elastic material (TREFIL E-601 available from Dow Corning Toray Silicone Co., Ltd.) having an average particle size of 2 μm and the surface thereof being introduced with epoxy groups and 70 parts by weight of γ-butyrolactone, a heat-resistant resin paste (9) was prepared by mixing and kneading with three-roll mills, and the material was evaluated in the same manner as in Example 21 except for using the paste. The evaluation results of the above-mentioned heat-resistant resin paste (9), the resin film and the semiconductor device obtained therefrom are shown in Table 3.

Example 25

To 176 parts by weight of polyimide type heat-resistant resin paste (5) (resin concentration of 30% by weight) obtained in Preparation example 5 were added 40 parts by weight of fine particles of silicone rubber elastic material (TREFIL E-601 available from Dow Corning Toray Silicone Co., Ltd.) having an average particle size of 2 μm and the surface thereof being introduced with epoxy groups and 95 parts by weight of γ-butyrolactone, a heat-resistant resin paste (10) was prepared by mixing and kneading with three-roll mills, and the material was evaluated in the same manner as in Example 21 except for using the paste. The evaluation results of the above-mentioned heat-resistant resin paste (10), the resin film and the semiconductor device obtained therefrom are shown in Table 3.

Example 26

To 316 parts by weight of polyimide type heat-resistant resin paste (2) (resin concentration of 30% by weight) obtained in Preparation example 2 was added 5 parts by weight of fine particles of silicone rubber elastic material (TREFIL E-601 available from Dow Corning Toray Silicone Co., Ltd.) having an average particle size of 2 μm and the surface thereof being introduced with epoxy groups, a heat-resistant resin paste (11) was prepared by mixing and kneading with three-roll mills, and the material was evaluated in the same manner as in Example 22 except for using the paste. The evaluation results of the above-mentioned heat-resistant resin paste (11), the resin film and the semiconductor device obtained therefrom are shown in Table 3.

TABLE 3

| Item | | Example 21 | Example 22 | Example 23 | Example 24 | Example 25 | Example 26 |
|---|---|---|---|---|---|---|---|
| Heat-resistant resin A" | | A"-1 | A"-2 | A"-3 | A"-4 | A"-5 | A"-2 |
| Heat-resistant resin B" | | B"-1 | B"-1 | B"-1 | B"-2 | B"-2 | B"-1 |
| Total amount of heat-resistant resin (solid component) | | 60 | 70 | 80 | 60 | 60 | 95 |
| Amount of Rubber elastic material (silicone rubber filler) | | 40 | 30 | 20 | 40 | 40 | 5 |
| Heat-resistant resin paste | | (6) | (7) | (8) | (9) | (10) | (11) |
| Viscosity (Pa · s) | | 350 | 250 | 350 | 200 | 100 | 560 |
| TI value | | 4.2 | 6.0 | 5.0 | 2.4 | 3.2 | 6.2 |
| Modulus of elasticity (GPa) @ −65° C. | | 1.0 | 1.3 | 1.4 | 1.0 | 1.0 | 2.7 |
| Modulus of elasticity (GPa) @ 25° C. | | 0.8 | 1.0 | 1.1 | 0.8 | 0.8 | 2.3 |
| Modulus of elasticity (GPa) @ 150° C. | | 0.6 | 0.7 | 0.8 | 0.6 | 0.6 | 1.9 |
| Change in modulus of elasticity (%) (150° C./−65° C.) | | 60 | 54 | 57 | 60 | 60 | 70 |
| Glass transition temperature (° C.) | | 280 | 220 | 200 | 265 | 255 | 225 |
| 5% Weight loss temperature (° C.) | | 420 | 405 | 400 | 375 | 390 | 410 |
| Mechanical strength (MPa) | | 40 | 50 | 50 | 30 | 35 | 50 |
| Printing property | Pattern flow | None | None | None | None | None | |
| | Blur | None | None | None | None | None | |
| Sputter resistance | | Good | Good | Good | Good | Good | Good |
| Temperature cycle test | | Good | Good | Good | Good | Good | Good |

Comparative Example 2

Evaluations were carried out in the same manner as in Example 21, except that the polyimide type heat-resistant resin paste (1) obtained in Preparation Example 1 was used in place of the heat-resistant resin paste (6) employed in Example 21. As a result, failure occurred in a heat cycle test of the semiconductor device. Also, the evaluation results of the above-mentioned polyimide type heat-resistant resin paste (1), the resin film and the semiconductor device obtained therefrom are shown in Table 4.

Comparative Example 3

Evaluations were carried out in the same manner as in Example 22, except that the polyimide type heat-resistant resin paste (2) obtained in Preparation Example 2 was used in place of the heat-resistant resin paste (7) employed in Example 22. As a result, failure occurred in a heat cycle test of the semiconductor device. Also, the evaluation results of the above-mentioned polyimide type heat-resistant resin paste (2), the resin film and the semiconductor device obtained therefrom are shown in Table 4.

Comparative Example 4

Evaluations were carried out in the same manner as in Example 21, except that the polyimide type heat-resistant resin paste (5) obtained in Preparation Example 5 was used in place of the heat-resistant resin paste (6) employed in Example 21. As a result, failure occurred in a heat cycle test of the semiconductor device. Also, the evaluation results of the above-mentioned polyimide type heat-resistant resin paste (5), the resin film and the semiconductor device obtained therefrom are shown in Table 4.

Comparative Example 5

Evaluations were carried out in the same manner as in Example 22, except that heat-resistant resin A"-2 solution obtained in Synthesis Example 3 was used in place of the heat-resistant resin paste (6) employed in Example 21. As a result, a pattern loosing occurred at the time of screen printing and the semiconductor device could not be produced. Also, the evaluation results of the above-mentioned heat-resistant resin A"-2 solution and the resin film obtained therefrom are shown in Table 4.

Comparative Example 6

Evaluations were carried out in the same manner as in Example 23, except that a resin paste, obtained by mixing the heat-resistant resin A"-3 solution obtained in Synthesis Example 4 and aerosil, which has a viscosity of 350 Pa·s and TI value of 5.0 was used in place of the heat-resistant resin paste (8) employed in Example 23. As a result, elasticity was 2.8 GPa at −65° C. and 0.2 GPa at 150° C., and a changed amount of the modulus of elasticity was 7%. In addition, a glass transition temperature was reduced to as low as 160° C., and cracking on the surface of the resin film was observed in a sputtering process during production of the semiconductor device. As a result, it was impossible to produce a semiconductor device. The evaluation results of the above-mentioned resin paste and the resin film obtained therefrom are shown in Table 4.

TABLE 4

| Item | | Comparative example 2 | Comparative example 3 | Comparative example 4 | Comparative example 5 | Comparative example 6 |
| --- | --- | --- | --- | --- | --- | --- |
| Heat-resistant resin A" | | A"-1 | A"-2 | A"-5 | A"-2 | A"-3 |
| Heat-resistant resin B" | | B"-1 | B"-1 | B"-2 | — | — |
| Total amount of heat-resistant resin (solid component) | | 100 | 100 | 100 | 100 | 100 |
| Amount of Rubber elastic material (silicone rubber filler) | | 0 | 0 | 0 | 0 | 0 |
| Heat-resistant resin paste | | (1) | (2) | (5) | (A-2 solution) | (A-3 solution + Aerosil) |
| Viscosity (Pa · s) | | 480 | 450 | 150 | 60 | 350 |
| TI value | | 3.0 | 5.5 | 3.5 | 1.1 | 5.0 |
| Modulus of elasticity (GPa) @ −65° C. | | 3.4 | 3.3 | 3.4 | 3.0 | 2.8 |
| Modulus of elasticity (GPa) @ 25° C. | | 3.1 | 3.1 | 3.1 | 2.7 | 2.3 |
| Modulus of elasticity (GPa) @ 150° C. | | 2.5 | 2.4 | 2.4 | 1.9 | 0.2 |
| Change in modulus of elasticity (%) (150° C./−65° C.) | | 74 | 73 | 71 | 63 | 7 |
| Glass transition temperature (° C.) | | 285 | 225 | 260 | 205 | 160 |
| 5% Weight loss temperature (° C.) | | 425 | 410 | 395 | 390 | 380 |
| Mechanical strength (MPa) | | 125 | 105 | 110 | 100 | 70 |
| Printing property | Pattern flow | None | None | None | Present | Present |
| | Blur | None | None | None | — | — |
| Sputter resistance | | Good | Good | Good | — | Crack occurred |
| Temperature cycle test | | Failure occurred | Failure occurred | Failure occurred | — | — |

Example 27

To 233 parts by weight of the polyimide type heat-resistant resin paste (GH-P500 available from Hitachi Chemical Co., Ltd.) were added 30 parts by weight of elastic silicone rubber particles (TREFIL E-601 available from Dow Corning Toray Silicone Co., Ltd.) having an average particle size of 2 μm and the surface thereof being modified with epoxy groups and 70 parts by weight of γ-butyrolactone, and the mixture was mixed and kneaded with three-roll mills to prepare a heat-resistant resin paste. After the resulting heat-resistant resin paste was degassed, on a semiconductor substrate which is a silicon wafer with a diameter of 8 inch and a thickness of 600 µm, on one side of which an electronic circuit was formed, having the plural number of electrodes connected to the circuit on the same side, and connected to the outside on a peripheral part, and on which a polyimide layer for purpose of protecting the electronic circuit was formed at least on the surface of the circuit, excluding the electrodes portion, the resulting heat-resistant resin paste was printed in a plural number in a state of an island, using a metal mask, at least on the surface of the circuit, excluding the above mentioned electrodes. This was heated for hardening purpose at 250° C. for one hour to obtain a resin layer. Then, on the resin layer surface of the above mentioned semiconductor substrate, a sputter layer such as Cr—Cu and Cr—Pd—Cu, etc. is to be formed with a thickness of 0.1 to 2 µm. Here, by using Cr—Cu, a metal sputter film with 0.5 µm was formed. Then, to form a second wiring layer, a plating resist with a thickness of 10 to 40 µm was formed on the above-mentioned sputter metal layer. A thickness of the plating resist can be selected according to the desired thickness of the electrolytic Cu plating. Here, a resist with a thickness of 20 µm was formed. After exposure, the plating resist was developed, and electrolytic Cu plating was laminated on the exposed portion of the sputter metal layer. After plating, the remaining plating resist was exfoliated to form a second wiring layer. A protective layer was then formed on the second wiring layer excluding a mounting part of solder balls. On the electrolytic Cu plating at which the solder ball (400 µm in diameter) is to be mounted, 0.3 µm of Ni—Au plating layer was formed, then the solder balls are mounted. Further, the above-mentioned semiconductor substrate was cut into pieces using a silicon wafer dicing device to obtain a semiconductor device.

Here, a modulus of elasticity was measured by using a viscoelasticity analyzer RSAII manufactured by Rheomethoric Scientific F. E. Co. with a temperature rising rate of 5° C./min and a frequency of 1 Hz. A glass transition temperature was measured by using a Thermomechanical analyzer TMA/SS6100 manufactured by Seiko Instruments Co. A viscosity was measured by using an E type viscometer (Type EHD-U manufactured by Tokyo Vantech Co.) with a rotation number of 0.5 $min^{-1}$ (25° C.). A thixotropic coefficient (hereinafter referred to as TI value) was shown as a ratio of apparent viscosity at 1 $min^{-1}$: η1 and apparent viscosity at 10 $min^{-1}$: η10, η1/η10.

Example 28

To 30 g of polyether amide imide powder was added 70 g of γ-butyrolactone followed by stirring. Next, the resultant mixture was heated at 150° C. for one hour. After heating was stopped, the mixture was cooled down by allowing to stand to the room temperature while stirring, to obtain a yellow-brownish paste. Next, to 100 g (nonvolatile content of 30 g) of the yellow-brownish paste was added 25 g of silicone rubber filler (TREFIL E-601 available from Dow Corning Toray Silicone Co., Ltd.) having an average particle size of 2 µm and the surface thereof being modified with epoxy groups, and the mixture was mixed, kneaded and dispersed with three-roll mills to prepare a resin paste. A semiconductor device was then produced in the same manner as in Example 1.

Example 29

The resin paste obtained in Example 28 was coated directly onto a semiconductor substrate of the same kind as in Example 27 by using a dispense nozzle (an inner diameter of 150 µm) to form a resin layer. A semiconductor device was then produced in the same manner as in Example 27.

Example 30

A semiconductor device was produced in the same manner as in Example 28 except that an amount of the silicone rubber fillers the surface of which was modified with epoxy groups, used in Example 28 was changed from 25 g to 30 g.

Comparative Example 7

A semiconductor device was produced in the same manner as in Example 27 except that the polyimide type heat-resistant resin paste used in Example 27 was solely used.

Comparative Example 8

A semiconductor device was produced in the same manner as in Example 27 except that the polyimide type heat-resistant resin paste obtained in Example 27 was suitably blended with silicon dioxide powders (Aerosil 200 available from Nippon Aerosil Co.) so that a viscosity of the paste exceeds 1000 Pa·s, and TI value exceeds 10.

In Comparative Example 8, the heat-resistant resin paste had a viscosity of 1200 Pa·s, and TI value of 10.2.

Comparative Example 9

A semiconductor device was produced in the same manner as in Example 28 except that the yellow-brownish resin paste obtained in Example 28 was suitably blended with silicon dioxide powders (Aerosil 200 available from Nippon Aerosil Co.) so that a viscosity of the paste exceeds 1000 Pa·s.

Comparative Example 10

A semiconductor device was produced in the same manner as in Example 28 except that in stead of using the silicone rubber filler the surface of which was modified with epoxy groups used in Example 28, acrylic rubber filler having an average particle diameter of 2 µm was used.

Comparative Example 11

A semiconductor device was produced in the same manner as in Example 28 except that an amount of the silicone rubber filler the surface of which was modified with epoxy groups used in Example 28 was changed from 25 g to 35 g.

Thus obtained semiconductor devices of Examples 27 to 30 and Comparative Examples 7 to 11 were, respectively, mounted onto a substrate (manufactured by Hitachi Chemical Co., Ltd., trade name: MCL E-67) on which electrodes were formed in the positions corresponding to the positions of the outer electrodes of the semiconductor device with a thickness of 1.6 mm and a size of 30 mm×30 mm. Then, it was charged in a heat-shock testing machine and subjected to a heat cycle test of −65° C./15 min and 150° C./15 min for 1000 cycles. Next, an electric resistance was measured at the solder connecting portion. Further, the semiconductor device was polished and failure at the solder connecting portion was observed and observation of peeling and crack at the inside of the semiconductor device were carried out. In Table 5, evaluation results of characteristics of the resin layers, and further temperature cycle resistance of the semiconductor device, and evaluation results during the production process of the semiconductor device prepared in Examples and Comparative examples are shown.

TABLE 5

| | | Example | | | | Comparative example | | | | |
|---|---|---|---|---|---|---|---|---|---|---|
| Item | | 27 | 28 | 29 | 30 | 7 | 8 | 9 | 10 | 11 |
| Modulus | −65° C. | 1.3 | 1.2 | 1.2 | 0.6 | 3.4 | 1.0 | 3.4 | 2.9 | 0.2 |
| of | 25° C. | 1.0 | 1.0 | 1.0 | 0.5 | 3.1 | 0.8 | 3.1 | 2.5 | 0.1 |
| elasticity | 150° C. | 0.7 | 0.8 | 0.8 | 0.3 | 2.5 | 0.6 | 2.5 | 0.2 | 0.1 |
| Change in modulus of elasticity (%) (150° C./−65° C.) | | 54 | 67 | 67 | 50 | 74 | 60 | 78 | 7 | 50 |
| Viscosity (Pa · s) | | 250 | 530 | 530 | 560 | 380 | 1200 | >1000 | 540 | 580 |
| TI value | | 6.0 | 4.2 | 4.2 | 4.0 | 3.0 | 10.2 | 3.9 | 3.8 | 4.2 |
| Glass transition temperature (° C.) | | 220 | 205 | 205 | 200 | 285 | 280 | 240 | 160 | 180 |
| 5% weight loss temperature (° C.) | | 405 | 405 | 405 | 400 | 425 | 420 | 440 | 380 | 395 |
| Resin forming method | | Printing | Printing | Dispense | Printing | Printing | Printing | Printing | Printing | Printing |
| Resin layer formability | | OK | OK | OK | OK | OK | OK | Printing NG | OK | OK |
| Temperature resistant cycle test (failure number/testednumber) | | 0/20 | 0/20 | 0/20 | 0/20 | 5/20 | — | — | — | 5/20 |

In Comparative Example 10, a modulus of elasticity was 2.9 GPa at −65° C. and 0.2 GPa at 150° C., and a changed amount of the modulus of elasticity was 7%. In addition, a glass transition temperature was reduced to as low as 160° C., and there was no sputtering resistant property observed during the production process of the semiconductor device, whereby it was impossible to conduct the production process of the second wiring, leading to inability to obtain a semiconductor device. It can be understood from Table 5 that, by using a resin for insulating semiconductor device shown in Examples 27 to 30, tolerance during the production process of the semiconductor device can be improved and further, reliability of the semiconductor device itself is markedly improved.

Example 31

To 233 parts by weight (resin concentration of 30% by weight) of the polyimide type heat-resistant resin paste (GH-P500 available from Hitachi Chemical Co., Ltd.) were added 30 parts by weight of fine particles of silicone rubber elastic material (TREFIL E-601 available from Dow Corning Toray Silicone Co., Ltd.) having an average particle size of 2 μm and the surface thereof being modified with epoxy groups and 50 parts by weight of γ-butyrolactone, and the mixture was mixed and kneaded with three-roll mills to prepare a heat-resistant resin paste. After the resulting heat-resistant resin paste was degassed, it was coated by a spin coater on a semiconductor substrate comprising a silicon wafer having a diameter of 8 inches and a thickness of 600 μm, on one surface of the wafer were formed a plural number of electronic circuits, and on the same surface, being formed a plural number of electrodes provided at the periphery of the electronic circuits, which electrodes connect to the electronic circuits and also connect to the wafer, and on which a polyimide film which is provided to protect the electronic circuits being formed at least on the electronic circuits except for the the electrode portions. This was heat-treated at 80°C. for 15 minutes, 100°C. for 10 minutes, 150°C. for 10 minutes, 200°C. for 15 minutes, and further, 250°C. for 60 minutes to obtain a resin layer.

Then, it was processed so that the electrode portions of the semiconductor elements are exposed by laser. On the resin layer surface of the above-mentioned semiconductor substrate, a metallic sputter layer such as Cr—Cu and Cr—Pd—Cu, etc. is to be formed with a thickness of 1 to 2 μm, and here, a Cr—Cu layer was formed with a thickness of 0.5 μm. Then, a plating resist with a thickness of 10 to 40μm is to be formed. A thickness of the plating resist can be selected according to the desired thickness of an electrolytic Cu plating. Here, a thickness of the resist was made 20 μm. After exposure, the plating resist was developed, and electrolytic Cu plating was laminated on the exposed portion of the sputter metal layer. After plating, the remaining plating resist was exfoliated to form a second wiring layer. A protective layer was then formed on the second wiring layer excluding a mounting part of solder balls. On the electrolytic Cu plating at which the solder ball (400 μm in diameter) is to be mounted, 0.3 μm of Ni—Au plating layer was formed, then the solder balls are mounted. Further, the above-mentioned semiconductor substrate was cut into pieces using a silicon wafer dicing device to obtain a semiconductor device.

Here, a modulus of elasticity was measured by using a viscoelasticity analyzer RSAII manufactured by Rheomethoric Scientific F. E. Co. with a temperature rising rate of 5° C./min and a frequency of 1 Hz. A glass transition temperature was measured by using a Thermomechanical analyzer TMA/SS6100 manufactured by Seiko Instruments Co. Modulus of elasticity values of the employed resins after heat treatment at temperatures of −65° C., 25° C. and 150° C., a changed ratio of the modulus of elasticity between −65° C. and 150° C., and a value of the glass transition temperature are shown in Table 1.

Example 32

To 30 g of polyether amide imide powder was added 70 g of γ-butyrolactone followed by stirring. Next, the resultant mixture was heated at 150° C. for one hour. After heating was stopped, it was cooled down by allowing to stand to the room temperature while stirring, to obtain a yellow-brownish paste. Then, to 100 g (nonvolatile content of 30 g) of the yellow-brownish paste was added 25 g of silicone rubber filler (TREFIL E-601 available from Dow Corning Toray Silicone Co., Ltd.) having an average particle size of 2 μm and the surface thereof being modified with epoxy groups. The mixture was mixed, kneaded and dispersed with three-roll mills to prepare a resin paste. A semiconductor device was then produced in the same manner as in Example 31.

Example 33

The heat-resistant resin paste obtained in Example 31 was coated on a polytetrafluoroethylene substrate using a bar coater, so that a thickness after heating and drying becomes 100 μm. This was heat-treated at 80° C. for 5 minutes, 100° C. for 10 minutes, 150° C. for 10 minutes, and 200° C. for 15 minutes to obtain a film-state resin. The film was laminated on a semiconductor substrate similar to that used in Example 31, followed by heat treatment at 250° C. for 60 minutes. A semiconductor device was then obtained in the same manner as in Example 31.

Example 34

A semiconductor device was produced in the same manner as in Example 32 except that an amount of the silicone rubber fillers the surface of which was modified with epoxy groups used in Example 32 was changed from 25 g to 30 g.

Comparative Example 12

A semiconductor device was produced in the same manner as in Example 31 except that the polyimide type heat-resistant resin paste used in Example 31 was used (no fine particles of silicone rubber elastic material was added).

Comparative Example 13

A semiconductor device was produced in the same manner as in Example 32 except that instead of using the silicone rubber filler the surface of which was modified with epoxy groups used in Example 32, acrylic rubber filler having an average particle diameter of 2 μm was used.

Comparative Example 14

A semiconductor device was produced in the same manner as in Example 32 except that an amount of the silicone rubber filler the surface of which was modified with epoxy groups, used in Example 32 was changed from 25 g to 35 g.

These semiconductor devices of Examples 31 to 34 and Comparative Examples 12 to 14 were, respectively, mounted onto a substrate (manufactured by Hitachi Chemical Co., Ltd., trade name: MCL E-67) on which electrodes were formed in the positions corresponding to the positions of the outer electrodes of the semiconductor device with a thickness of 1.6 mm and a size of 30 mm×30 mm. Next, it was charged in a heat-shock testing machine and subjected to a heat cycle test of −65° C./15 minutes, and 150° C./15 minutes for 1000 cycles. Next, an electric resistance was measured at the solder connecting portion.

Further, the semiconductor device was polished and failure at the solder connecting portion was observed, and observation of peeling and crack at the inside of the semiconductor device were carried out. The results are shown in Table 6.

In Comparative Example 13, the modulus of elasticity was 2.9 GPa at −65° C. and 0.2 GPa at 150° C., and a changed amount of the modulus of elasticity was 7%. Moreover, a glass transition temperature was reduced to as low as 160° C., and there was no sputtering resistance property during the production process of the semiconductor device, whereby it was impossible to conduct the production process of the second wiring layer, leading to inability of obtaining a semiconductor device.

On the contrary, it can be understood that, by using a resin shown in Examples 31 to 34, resistance during the production process of the semiconductor device can be improved and further, reliability of the semiconductor device itself is markedly improved.

Example 35

Using FIG. 1, one example of the present invention is explained.

To 233 parts by weight of the polyimide type heat-resistant resin paste (GH-P500 available from Hitachi Chemical Co., Ltd.) were added 30 parts by weight of fine particles of silicone rubber elastic material (TREFIL E-601 available from Dow Corning Toray Silicone Co., Ltd.) having an average particle size of 2 μm and the surface thereof being modified with epoxy groups and 50 parts by weight of γ-butyrolactone, and the mixture was mixed and kneaded with three-roll mills and degassed to prepare a heat-resistant resin paste. The heat-resistant resin paste was coated on a polytetrafluoroethylene substrate using a bar coater, so that a thickness after heating and drying becomes 25 μm. This was subjected to heat-treatment at 80° C. for 5 minutes, 100° C. for 10 minutes, 150° C. for 10 minutes, and 200° C. for 15 minutes and further, 250° C. for 60 minutes to obtain a resin film. A modulus of elasticity of the resin film was measured by using a viscoelasticity analyzer RSAII manufactured by Rheometric Scientific F. E. Co., with a temperature rising rate of 5° C./min, and a frequency of 1 Hz.

On a semiconductor wafer 3 with a diameter of 8 inch and a thickness of 600 μm, on which an electronic circuit was formed, the heat-resistant resin paste was printed by using a screen printer (LS-34GX attached with an alignment device manufactured by New Long Seimitsu Kogyo K.K.) and a metal mask (manufactured by Mesh Kogyo Co., thickness: 100 μm). The printed portion is the same as an outer shape of the semiconductor device and is a range excluding the dicing area 8. This was heat-treated at 80° C. for 5 minutes, 100° C.

TABLE 6

| Item | | Example | | | | Comparative example | | |
|---|---|---|---|---|---|---|---|---|
| | | 31 | 32 | 33 | 34 | 12 | 13 | 14 |
| Modulus | −65° C. | 1.3 | 1.2 | 1.3 | 0.6 | 3.4 | 2.9 | 0.2 |
| of | 25° C. | 1.0 | 1.0 | 1.0 | 0.5 | 3.1 | 2.5 | 0.1 |
| elasticity | 150° C. | 0.7 | 0.8 | 0.7 | 0.3 | 2.5 | 0.2 | 0.1 |
| Change in modulus of elasticity (%) (150° C./−65° C.) | | 54 | 67 | 54 | 50 | 74 | 7 | 50 |
| Glass transition temperature (° C.) | | 220 | 205 | 220 | 200 | 285 | 160 | 180 |
| Resin forming method | | Spin coating | Spin coating | Laminate | Spin coating | Spin coating | Spin coating | Spin coating |
| Resin layer formability | | OK | OK | OK | OK | OK | — | OK |
| Temperature resistant cycle test (failure number/tested number) | | 0/20 | 0/20 | 0/20 | 0/20 | 5/20 | — | 5/20 | for 10 minutes, 150° C. for 10 minutes, 200° C. for 15 minutes, and further, 250° C. for 60 minutes to obtain a resin layer 1 (FIG. 1(b)).

Then, it was processed by laser with a diameter of 50 μm until the electrode pad 5 is exposed at the desired position of the resin layer 1 (FIG. 1(c)).

On the upper surface of he resin layer 1, a sputter metal film of Cr was formed with a thickness of 0.5 μm by using a sputtering apparatus, a plate resist layer was coated on the sputter metal layer with a thickness of 20 μm, a plate resist layer was formed by exposure and developing treatment at which a Cu plate wiring is to be formed, after reaching the Cu wiring to 15μm, the plate resist was peeled off, and further, the portion at which the sputter metal film had been exposed was removed to form a second wiring layer 6 (FIG. 1(d)).

On the resin layer 1 at which the second wiring layer 6 had been formed, the above-mentioned heat-resistant resin paste was printed by using a screen printing machine (manufactured by New Long Seimitsu Kogyo, K.K., LS-34GX attached with an alignment apparatus) and a metal mask (manufactured by Mesh Kogyo K.K., thickness: 40 μm) so that the thickness after heating and drying becomes 20 μm. The printed portion is the same as an outer shape of the semiconductor device and a range excluding the dicing area 8. This was subjected to heat treatment at 80° C. for 5 minutes, 100° C. for 10 minutes, 150° C. for 10 minutes, 200° C. for 15 minutes, and further, 250° C. for 60 minutes to obtain a protective layer 2 of the second wiring layer (FIG. 1(e)).

At the desired position of the protective layer of the second wiring layer, processing was carried out until the second wiring layer 6 was exposed by laser with a diameter of 300 μm to obtain an outer connection terminal 7 (FIG. 1(f)).

The semiconductor wafer 3 was cut at the dicing area 8 to form the respective semiconductor devices (FIG. 1(g)).

At the outer connection terminal 7 of the semiconductor device, solder ball with a diameter of 0.40 mm was mounted, and then, the semiconductor device was mounted on a substrate (manufactured by Hitachi Chemical Co., Ltd., trade name: MCL E-67) on which electrodes had been formed at the positions corresponding to the outer electrode terminals of a semiconductor device having a size of 30 mm×30 mm and a thickness of 1.6 mm. This product was placed in a thermal shock testing machine and a temperature cycle test were carried out 1000 cycles wherein −65° C. for 15 minutes and 150° C. for 15 minutes is one cycle.

Example 36

To 30 g of polyether amide imide powder was added 70 g of γ-butyrolactone and the mixture was stirred. Next, the mixture was heated at 150° C. for one hour. After stopping the heating, the mixture was naturally cooled by allowing to stand to room temperature under stirring to obtain a yellow-brownish paste. Then, to 100 g (nonvolatile component: 30 g) of the yellow-brownish paste was added 25 g of a silicone rubber filler (TREFIL E-601 available from Dow Corning Toray Silicone Co., Ltd.) having an average particle size of 2 μm and the surface of which was modified by epoxy groups, and the mixture was mixed, kneaded and dispersed by the three-roll mixer to obtain a resin paste. A semiconductor device was then obtained in the same manner as in Example 35.

Example 37

A semiconductor device was obtained in the same manner as in Example 36 except for changing an amount of the silicone rubber filler the surface of which was modified by epoxy groups from 25 g to 30 g.

Comparative Example 15

A semiconductor device was prepared in the same manner as in Example 35 except for using the polyimide type heat-resistant resin paste of Example 35.

Comparative Example 16

A semiconductor device was prepared in the same manner as in Example 36 except for using an acryl rubber filler having an average particle size of 2 μm in place of the silicone rubber filler the surface of which had been modified by epoxy groups of Example 36.

Comparative Example 17

A semiconductor device was prepared in the same manner as in Example 36 except for changing the amount of the silicone rubber filler the surface of which had been modified by epoxy groups from 25 g to 35 g of Example 36.

With regard to the thus obtained semiconductor devices of Examples 35 to 37 and Comparative Examples 15 to 17, modulus of elasticities, glass transition temperatures, temperature cycle tests and resin layer formability were evaluated or measured. Further, when failure occurred, the semiconductor device was polished and exfoliation and crack at the solder connecting portion or inside of the semiconductor device were observed. The results are shown in Table 7. As a result, in Examples 35 to 37, no failure at the solder connecting portion nor exfoliation or crack at the inside of the semiconductor device was observed by 1000 cycles.

TABLE 7

| Item | Example | | | Comparative example | | |
|---|---|---|---|---|---|---|
| | 35 | 36 | 37 | 15 | 16 | 17 |
| Modulus of elasticity (GPa, 25° C.) | 1.0 | 1.0 | 1.0 | 3.1 | 2.5 | 0.1 |
| 5% weight loss temperature (° C.) | 405 | 405 | 405 | 425 | 420 | 395 |
| Glass transition temperature (° C.) | 220 | 220 | 220 | 285 | 160 | 180 |
| Resin layer formability | OK | OK | OK | OK | — | OK |
| Temperature resistant cycle test (failure number/tested number) | 0/20 | 0/20 | 0/20 | 5/20 | — | 5/20 |
| Failure position | — | — | — | Solder connecting portion | — | Breakage of wiring |

In Comparative Example 16, a glass transition temperature was reduced to as low as 160° C., and there was no sputtering resistance property during the production process of the semiconductor device, whereby it was impossible to conduct the production process of the second wiring layer, leading to inability to obtain a semiconductor device. From Table 7, by using the resin layer of Examples 35 to 37, resistance during the production process of the semiconductor device can be improved and further, reliability of the semiconductor device itself is markedly improved.

UTILIZABILITY IN INDUSTRY

According to the resin composition of the present invention, a coated film having the same resin characteristics as in the polyimide, i.e., high strength and excellent in flexibility can be obtained without imidation step. Moreover, it is possible to form a precise pattern by screen printing or dispense coating, etc., so that a semiconductor device using the resin composition of the present invention gives good characteristics.

The heat-resistant resin paste of the present invention can be widely utilized for a coating material, an adhesive, a stress relaxing material of a semiconductor device, etc., a modulus of elasticity of which can be optionally controlled and capable of forming a resin film excellent in heat resistance. Also, it has thixotropic property and can be applied to a coating system excellent in coating efficiency such as screen printing or dispense.

The semiconductor device of the present invention has a resin film obtained from a heat-resistant resin paste which has a thixotropic property, and can be widely utilized for a coating material, an adhesive, a stress relaxing material of a semiconductor device, etc., elasticity of which can be optionally controlled and capable of forming a resin film excellent in heat resistance.

According to the present invention, the resin layer is low elasticity so that a stress applied to an outer electrode terminal after packaging can be well relaxed and has heat-resistance so that resistance at the step of forming a second wiring layer by sputtering is excellent. Moreover, it is excellent in solvent resistance at the step of forming a second wiring layer by plating. Furthermore, by using the resin having the above-mentioned characteristics, a semiconductor device excellent in reliability can be obtained without using an underfill resin.

The present invention further provides a method of producing a semiconductor device excellent in adhesiveness between the resin layer and the wiring protecting layer, and semiconductor devices excellent in packaging reliability can be integrally formed on a semiconductor wafer.

The invention claimed is:

1. A method of producing a semiconductor device which comprises a step of forming a plural number of resin layers on a semiconductor wafer on which a first wiring layer has been formed by printing a resin having a modulus of elasticity at 25° C. of 0.2 to 3.0 GPa, a glass transition temperature oil 180° C. or higher and a 5% weight-loss temperature of 300° C. or higher; a step of forming a second wiring layer on the resin layer which is electrically connected to an electrode on the semiconductor wafer; a step of forming a plural number of protective layers of the second wiring layer by printing the above resin on the second wiring layer; a step of providing a through hole(s) at the protective layer of the second wiring layer penetrating to the second wiring layer; and a step of forming an outer electrode terminal to the through hole(s); and a step of cutting the semiconductor wafer at a cutting portion to obtain respective semiconductor devices, wherein a range of the printing of the resin layer is a range excluding the cutting portion.

2. The method of producing a semiconductor device according to claim 1, wherein a range of the printing of the second wiring layer is a range excluding the cutting portion.

3. A semiconductor device produced by the method of producing a semiconductor device according to claim 1.

4. The method of producing a semiconductor device according to claim 1, wherein the first wiring player is part of a plurality of electronic circuits.

5. The method of producing a semiconductor device according to claim 4, wherein the electrodes are provided at a periphery of the electronic circuits.

6. The method of producing a semiconductor device according to claim 5, wherein the electrodes connect to the electronic circuits.

* * * * *